United States Patent
Van Winkelhoff et al.

(10) Patent No.: US 9,036,427 B2
(45) Date of Patent: May 19, 2015

(54) APPARATUS AND A METHOD FOR ERASING DATA STORED IN A MEMORY DEVICE

(71) Applicant: ARM LIMITED, Cambridge (GB)

(72) Inventors: Nicolaas Klarinus Johannes Van Winkelhoff, Villard Bonnot (FR); Ali Alaoui, Grenoble (FR); Pierre Lemarchand, Grenoble (FR); Bastien Jean Claude Aghetti, Grenoble (FR)

(73) Assignee: ARM Limited, Cambridge (GB)

( * ) Notice: Subject to any disclaimer, the term of this patent is extended or adjusted under 35 U.S.C. 154(b) by 67 days.

(21) Appl. No.: 13/943,029

(22) Filed: Jul. 16, 2013

(65) Prior Publication Data
US 2014/0369139 A1 Dec. 18, 2014

Related U.S. Application Data

(63) Continuation-in-part of application No. 13/915,918, filed on Jun. 12, 2013, now Pat. No. 8,885,429.

(51) Int. Cl.
*G11C 16/04* (2006.01)
*G11C 7/24* (2006.01)
(Continued)

(52) U.S. Cl.
CPC .. *G11C 7/24* (2013.01); *G11C 8/20* (2013.01); *G11C 16/22* (2013.01); *G11C 7/22* (2013.01)

(58) Field of Classification Search
USPC ............................ 365/185.29, 185.04, 185.18
See application file for complete search history.

(56) References Cited

U.S. PATENT DOCUMENTS 5,668,760 A * 9/1997 Hazen ..................... 365/189.14
6,292,012 B1 9/2001 Yeh et al.
(Continued)

FOREIGN PATENT DOCUMENTS

EP 1 542 180 6/2005
GB 2 460 213 11/2009
WO 2008/150939 12/2008

OTHER PUBLICATIONS

Notice of Allowance mailed Jul. 16, 2014 in co-pending U.S. Appl. No. 13/915,918.
(Continued)

*Primary Examiner* — Vu Le
(74) *Attorney, Agent, or Firm* — Nixon & Vanderhye P.C.

(57) ABSTRACT

The present invention provides an apparatus and method for erasing data in a memory device comprising an array of memory cells, and configured to operate from a clock signal. The apparatus includes erase circuitry, responsive to receipt of an erase signal in an asserted state, to perform a forced write operation independently of the clock signal in respect of each memory cell within a predetermined erase region of said array. Further, erase signal generation circuitry is configured to receive a control signal and to maintain said erase signal in a deasserted state provided that the control signal takes the form of a pulse signal having at least a predetermined minimum frequency between pulses. The erase signal generation circuitry is further configured to issue said erase signal in said asserted state if the control signal does not take the form of said pulse signal. Such an approach enables the security of a memory device to be improved, and in particular prevents hackers from taking advantage of data remanence effects, by ensuring that stored data is overwritten in an efficient, and clock independent, manner, triggered by assertion of an erase signal generated if a pulse-based control signal does not take it is expected form.

21 Claims, 23 Drawing Sheets

(51) Int. Cl.
*G11C 8/20* (2006.01)
*G11C 16/22* (2006.01)
*G11C 7/22* (2006.01)

(56) References Cited

U.S. PATENT DOCUMENTS 6,333,892 B2  12/2001  Hamamoto et al.
6,334,190 B1  12/2001  Silverbrook et al.
7,570,532 B1  8/2009  Lloyd
2006/0013043 A1  1/2006  Matsuoka
2006/0161825 A1*  7/2006  Lomazzi et al. .............. 714/718

OTHER PUBLICATIONS

Extended European Search Report dated Nov. 21, 2014 in EP 14170409.8, 10 pages.

* cited by examiner

INPUT frequency = CLK frequency

INPUT frequency ≠ CLK frequency

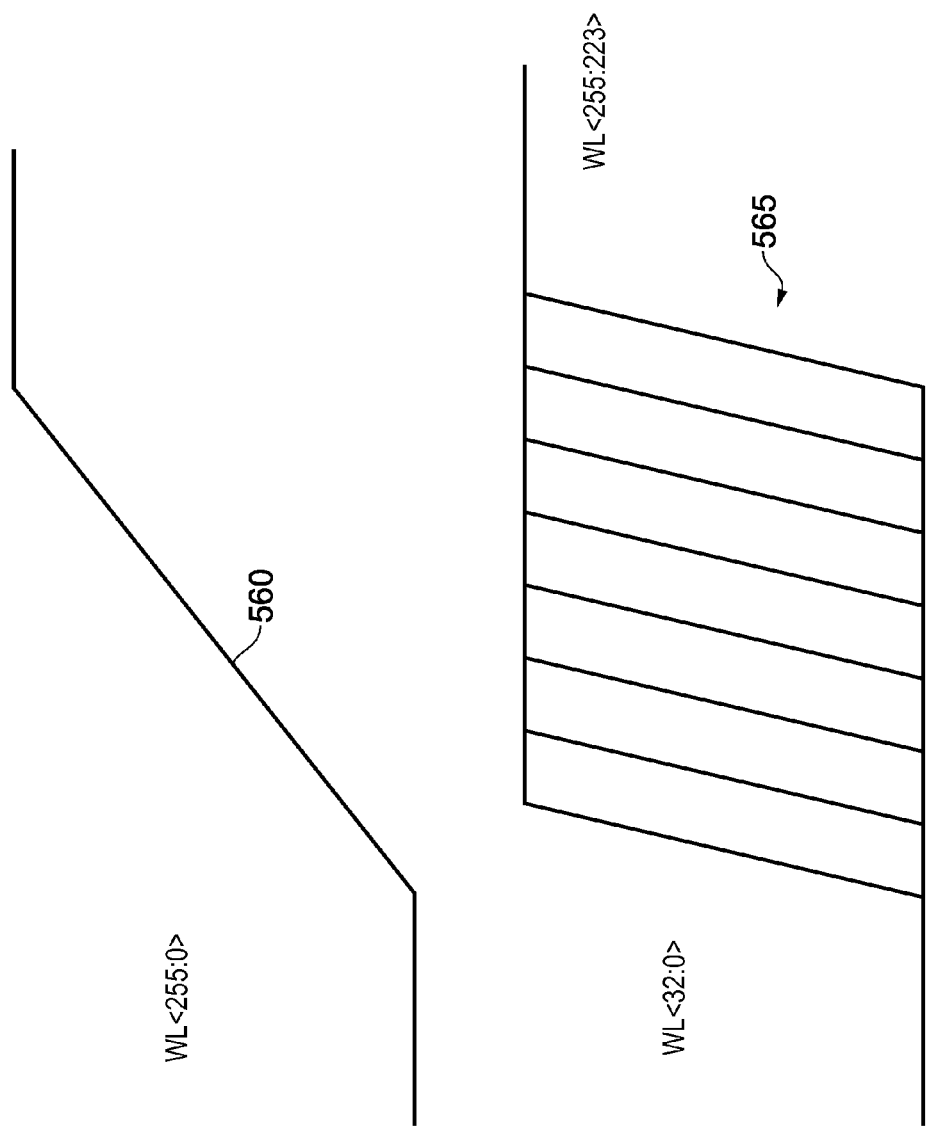

APPARATUS AND A METHOD FOR ERASING DATA STORED IN A MEMORY DEVICE

This application is a continuation-in-part of application Ser. No. 13/915,918, filed Jun. 12, 2013, the entire content of which is hereby incorporated by reference in this application.

BACKGROUND OF THE INVENTION

1. Field of the Invention

The present invention relates to an apparatus and method for erasing data stored within a memory device.

2. Description of the Prior Art

In a typical memory device comprising an array of memory cells arranged in rows and columns, data remanence may be observed since such a memory device often retains its last stored value even after the processing device using that memory device has no further need for that stored value, and hence the memory cells storing that value are available for overwriting with new data. Only once those memory cells have actually been overwritten with new data will the old data no longer be available in the memory device.

However, arranging the processing device to take positive steps to overwrite data within the memory device as soon as it has finished using that data has typically been considered to incur too much of a performance penalty, particularly where that data is stored within memory cells occupying multiple rows of the memory array, and accordingly a sequence of write operations would be required to overwrite the data one row at a time.

When the memory device is used to store sensitive data, it is hence more common to rely on software protection measures to ensure that that sensitive data is not accessed by applications that are not authorised to access it. However, it has been found that such software protection measures are prone to attack by hackers seeking to access that sensitive data.

For example, one known approach, often referred to as a cold boot attack, involves turning off the system incorporating the memory device and associated processing device, and then turning it on again. This allows the software protection measure to be circumvented. Under normal conditions, this would not be a problem, as removing the power supply to the memory device would typically result in the stored data being lost. However, it has been found that even after the power has been removed from the memory device, the information stored therein can remain for a prolonged period of time when special, external, conditions are applied, this providing another form of data remanence. One example of such a special external condition is to subject the memory device to a low temperature before removing the power. Under such conditions, once the power is restored, the software protection will have been circumvented, and the data may still be extracted from the memory device.

It would be desirable to provide an improved technique for preventing access to previously stored data in a memory device.

SUMMARY OF THE INVENTION

Viewed from a first aspect, the present invention provides an apparatus comprising: a memory device comprising an array of memory cells, and configured to operate from a clock signal; erase circuitry, responsive to receipt of an erase signal in an asserted state, to perform a forced write operation independently of the clock signal in respect of each memory cell within a predetermined erase region of said array; and erase signal generation circuitry configured to receive a control signal and to maintain said erase signal in a deasserted state provided that the control signal takes the form of a pulse signal having at least a predetermined minimum frequency between pulses; the erase signal generation circuitry being configured to issue said erase signal in said asserted state if the control signal does not take the form of said pulse signal.

In accordance with the present invention, erase circuitry is provided in association with the memory device, that is responsive to an asserted erase signal, to perform a forced write operation independently of the clock signal received by the memory device, the forced write operation being performed in respect of each memory cell within a predetermined erase region of the memory array. Further, erase signal generation circuitry is configured to generate the erase signal dependent on a received control signal, such that if the control signal takes the form of a pulse signal having at least a predetermined minimum frequency between pulses, the erase signal is maintained in a de-asserted state, but whenever the control signal does not take that form, the erase signal is then asserted to cause the forced write operation to take place.

Such an approach enables the security of a memory device to be improved, and in particular prevents hackers from taking advantage of the earlier mentioned data remanence effects, by ensuring that stored data is overwritten in an efficient, and clock independent, manner, triggered by assertion of an erase signal generated if a pulse-based control signal does not take it is expected form. Since the forced write operation occurs independently of the clock signal, once the erase signal has been asserted a hacker will be unable to prevent the forced write operation taking place merely by seeking to remove the clock signal from the memory device.

The predetermined erase region can take a variety of forms. For example, it may be chosen to be the entire memory array, or instead could be chosen to be a predetermined area of the array in which certain secure data is stored, for example encryption keys or parts of encryption keys, decipher results, etc. The predetermined erase region may occupy one or more rows of the memory array, and/or may occupy one or more columns of the memory array. However the predetermined erase region is defined, the above described mechanism provides a particular efficient technique for erasing the data in that region.

Whilst the above approach is particularly useful for protecting secure data from a hacking attack, the technique can also be used for other reasons not related to security. Purely by way of example, if the memory device takes the form of a cache memory comprising a tag array and a data array, each entry in the tag array typically comprises a valid bit to identify whether the corresponding cache line in the data array is valid or not. On a reset of the cache memory, each of the valid bits needs to be cleared, and typically this will involve issuing a separate write operation in respect of every tag entry, hence taking a significant amount of time to perform. However, in accordance with the present invention, a predetermined erase region can be defined to include the column of the array containing the valid flags for every tag entry, and when it is necessary to reset the cache, an asserted erase signal can be issued to cause the above described erase functionality to write the relevant bit value into each of the valid flags to identify those entries as being invalid (typically this involving writing a logic zero value into each of the valid flag positions).

The erase signal generation circuitry can take a variety of forms, but in one embodiment comprises capacitor circuitry, and output circuitry configured to generate the erase signal in dependence on an output from the capacitor circuitry. The capacitor circuitry is configured to switch between a charging operation and a discharging operation dependent on the control signal, and the output circuitry is configured to generate the erase signal in said asserted state if the output from the capacitor circuitry reaches a predetermined activation voltage level. Further, if the control signal takes the form of said pulse signal the output from the capacitor circuitry is configured not to reach said predetermined activation voltage level, thereby causing the erase signal to be maintained in said de-asserted state.

Hence, in accordance with this configuration of erase signal generation circuitry, if the control signal includes regular pulses having at least the predetermined minimum frequency, the switching between the charging and discharging operations of the capacitor circuitry will be such that the output from the capacitor circuitry does not reach the predetermined activation voltage level. However, if the control signal is tampered with so as to prevent such pulses, or reduce the frequency of those pulses below the above-mentioned predetermined minimum frequency, then the output from the capacitor circuitry will reach the predetermined activation voltage level, and trigger assertion of the erase signal.

The predetermined activation voltage level may be a voltage level that the capacitor circuitry discharges to in the absence of the regular control signal, or a voltage level that the capacity circuitry charges to in the absence of the regular control signal. In one embodiment, the predetermined activation voltage level is a voltage level that the capacity circuitry charges to in the absence of the regular control signal, and the capacitor circuitry is configured to perform said charging operation whenever the control signal does not contain a pulse, and to switch to said discharging operation for the duration of each pulse in said control signal. Hence, in such an embodiment, it is the presence of the regular pulses at at least the predetermined minimum frequency that stops the capacitor charging up to the predetermined activation voltage level.

In one embodiment, the erase signal generation circuitry comprises a current controlled inverter circuit configured to provide an input to the capacitor circuitry in dependence on the control signal. By the use of such a current controlled inverter circuit, the rate at which the capacitor circuitry charges or discharges can be tuned.

For example, in one embodiment, the apparatus further comprises bias voltage generation circuitry configured to generate a bias voltage provided to at least one component within the current controlled inverter circuitry to control a rate at which the voltage level of the output of the capacitor circuitry changes during at least one of said charging operation and said discharging operation. In one particular embodiment, the current controlled inverter circuitry is configured to use the bias voltage to control the rate at which the voltage level of the output of the capacitor circuitry changes during the charging operation, the charging operation taking place when a pulse is not present in the control signal.

The control signal input to the erase signal generation circuitry can be generated in a variety of ways. In one embodiment, the apparatus further comprises control signal generation circuitry configured to generate the control signal input to the erase signal generation circuitry, the control signal generation circuitry comprising edge detector circuitry configured to receive an input signal and to generate a pulse within said control signal each time the input signal changes state between first and second voltage levels. By using such control signal generation circuitry to generate the required pulses within the control signal, this avoids the designer of the apparatus having to separately generate the control signal with the required specific pulses expected by the erase signal generation circuitry, and instead the developer merely needs to generate an input signal which changes state between the first and second voltage levels at at least the earlier mentioned predetermined minimum frequency. Each such transition in state of the input signal will then cause the required pulse signal to be inserted in the control signal.

The edge detector circuitry can be constructed in a variety of ways, but in one embodiment comprises delay circuitry configured to generate a delayed input signal, and comparison circuitry configured to generate each said pulse dependent on a comparison between said input signal and said delayed input signal. This provides a particularly efficient mechanism for generating the required pulses, and in one embodiment the delay introduced by said delay circuitry determines a width of each pulse generated by the edge detector circuitry.

In one embodiment, bias voltage generation circuitry is configured to generate a bias voltage provided to at least one component within the delay circuitry in order to control said delay introduced by said delay circuitry. As a result, this enables the width of the pulse is generated by the edge detector circuitry to be tuned, dependent on the bias voltage produced by the bias voltage generation circuitry.

In one embodiment, the control signal generation circuitry further comprises pulse override circuitry configured, on detection of at least one predetermined condition, to prevent the control signal from taking the form of said pulse signal irrespective of the output of the edge detector circuitry, to thereby cause the erase signal generation circuitry to issue said erase signal in said asserted state.

The predetermined condition can be specified to take account of a variety of situations where it may be desirable to assert the erase signal irrespective of the output from the edge detector circuitry. For example, in one embodiment, the at least one predetermined condition comprises a condition indicating potential tampering with the input signal provided to the edge detector circuitry.

In particular, in certain implementations there may be a possibility that a hacker could seek to modify the input signal in a way that ensures that the edge detector circuitry continues to generate pulses within the control signal at the required interval to prevent the erase signal being asserted, in situations where the normal, untampered, input signal would cause the edge detector circuitry to generate a control signal causing the erase signal to be asserted. For example, a hacker may seek to take a clock signal present within the apparatus and apply it as the input signal, and provided that clock signal was of a suitable frequency, this could cause the edge detector circuitry to continue to insert pulses within the control signal at the required interval to prevent the erase signal being asserted.

In one embodiment, in order to prevent such a scenario arising, the pulse override circuitry may comprise frequency comparator circuitry configured to detect if the input signal has the same frequency as a clock signal supplied to said frequency comparator circuitry (for example a system clock, or the clock signal used to operate the memory device (often the same frequency as the system clock but shifted in time)), and in that event to prevent the control signal from taking the form of said pulse signal irrespective of the output of the edge detector circuitry. Hence, this will cause the erase signal to be asserted, and accordingly cause the predetermined erase region of the array to be subjected to the forced write operation in order to overwrite any currently stored data in that region.

The frequency comparator circuitry can take a variety of forms, but in one embodiment comprises a first flip flop circuit and a second flip flop circuit, both the first and second flip flop circuits being configured to receive said input signal, and being operated such that on a rising edge of a received clock signal the first flip flop circuit outputs a current value of the input signal received by the first flip flop circuit, and on a falling edge of the received clock signal the second flip flop outputs an inverted version of the current value of the input signal received by the second flip flop circuit.

In one embodiment, the outputs from both the first and second flip flop circuits are subjected to a logical XOR operation in order to generate an output from the frequency comparator circuitry. Accordingly, if the input signal is merely created from the clock signal, the output from the frequency comparator circuitry will be at logic zero value, whereas if the input signal is in fact generated separately to the clock signal, and accordingly has a different frequency, the output from the frequency comparator circuitry will predominately be at a logic one value.

Accordingly, in one such embodiment, the apparatus further comprises logical AND circuitry configured to receive the output from the edge detector circuitry and the output from the pulse override circuitry and to perform a logical AND operation in order to generate said control signal, the pulse override circuitry being configured to generate a logic 1 output value in the absence of said at least one predetermined condition, but being configured to generate a logic 0 output value whilst said at least one predetermined condition is detected. Hence, in the presence of the at least one predetermined condition, one of the inputs to the logical AND circuitry will be held at a logic zero value, and will accordingly cause the output of that logical AND circuitry (i.e. the control signal) to be at a logic zero value irrespective of the signal received from the edge detector circuitry. The absence of pulses in the control signal will then cause the erase signal to be asserted.

The erase circuitry can be configured in a variety of ways. In one embodiment, the array of memory cells is arranged as a plurality of rows and columns, each row of memory cells being coupled to an associated word line, and each column of memory cells being coupled to an associated at least one bit line, and the apparatus further comprises: decoder circuitry configured to be responsive to a write operation to decode an address indication associated with the write operation in order to determine the row containing addressed memory cells for the write operation, and to issue, in dependence on said clock signal, an asserted word line signal on the associated word line for the determined row; and write circuitry configured to be responsive to said write operation to control a voltage level of the associated at least one bit line for each of said addressed memory cells to cause write data to be written into said addressed memory cells. In such an embodiment, the erase circuitry may comprise the decoder circuitry and the write circuitry, the decoder circuitry being configured to be responsive to said asserted erase signal to issue, independently of said clock signal, said asserted word line signal on the word line associated with each row in said predetermined erase region, and the write circuitry being configured to be responsive to said asserted erase signal to control the voltage level of the associated at least one bit line for each memory cell in said predetermined erase region, in order to cause erase write data to be written into the memory cells of said predetermined erase region.

In accordance with such an embodiment, the normal operation of the decoder circuitry and write circuitry is modified upon receipt of an asserted erase signal. In particular, during a normal write operation, the decoder circuitry will typically assert a word line signal on a single word line associated with the row that contains the addressed memory cells for the write operation. However, in response to the asserted erase signal, the decoder circuitry issues an asserted word line signal on the word line associated with each row in a predetermined erase region of the array. Hence, if that predetermined erase region occupies multiple rows of the array, this will result in multiple word lines being activated. In addition, in the presence of the asserted erase signal, the decoder circuitry is configured to issue such asserted word line signals independently of the clock signal. This means that once the erase signal has been asserted, an asserted word line signal will be issued in respect of each row in the predetermined erase region irrespective of the state of the clock. Accordingly, a hacker will be unable to prevent this modified behavior of the decoder circuitry merely by seeking to remove the clock signal from the memory device.

The write circuitry is then configured to be responsive to the asserted erase signal to control the voltage level on at least one bit line for each memory cell in the predetermined erase region, in order to cause erase write data to be written into the memory cells of the predetermined erase region. The erase write data can take a variety of forms. In some embodiments that erase write data may be predetermined, whilst in other embodiments such erase write data is instead generated randomly, or the write circuitry is used to merely write into the memory device the data currently present at the input pins of the memory device. Whatever the form of the erase write data, it will be used to positively overwrite the current data stored in the predetermined erase region. As a result, it can be seen that by such a mechanism the asserted erase signal is used to trigger a forced write operation in respect of each memory cell within the predetermined erase region in a clock independent manner.

However the predetermined erase region is defined, the above-described mechanism provides a particularly efficient technique for erasing the data in that region, since it avoids the need for a separate write operation to be issued under software control for each row within the predetermined erase region. Instead, in response to the asserted erase signal, the decoder circuitry automatically asserts word line signals in respect of every row in the predetermined erase region. These word line signals can be asserted in parallel, and the same erase write data is written into every row within the predetermined erase region. As will be discussed in more detail later, in certain embodiments there can be a benefit to staggering the assertion of the word line signals slightly so that not all of the rows in the predetermined erase region are written to at exactly the same time. However, the same erase write data is still written into every row.

In addition to the modified behavior of the decoder circuitry and write circuitry being clock independent, in one embodiment the decoder circuitry and write circuitry are configured to be responsive to the asserted erase signal independent of a current operating state of the memory device at a time the erase signal is asserted. In particular, the current operating state may be any powered state of the memory device, and hence for example the memory device may be in a read state where it is performing a read operation, a write state where it is performing a write operation, an idle state where it is currently performing no operation, or a non-enabled state (for example where a chip enable signal is deasserted in order to deselect the memory device). Irrespective of which operating state the memory device is in at the time the erase signal is asserted, the decoder circuitry and write circuitry will still operate in response to that asserted erase signal to perform the forced write operation discussed earlier in order to write erase write data into each memory cell of the predetermined erase region.

The decoder circuitry can take a variety of forms. However, in one embodiment the decoder circuitry comprises first stage decoding circuitry configured to generate a plurality of intermediate signals in response to the address indication, and further stage decoding circuitry configured to generate the asserted word line signal in dependence on values of the intermediate signals. The decoder circuitry is then configured to be responsive to the asserted erase signal to set the intermediate signals to values which will cause the further stage decoding circuitry to then issue the asserted word line signal on the word line associated with each row in the predetermined erase region.

Hence, in such embodiments, the decoder circuitry modifies its behavior upon receipt of the asserted erase signal by manipulating the intermediate signals generated by the first stage decoding circuitry. By taking such an approach, the decoder circuitry is then able to deviate from its normal operation that would restrict it to asserting only a single word line signal at any point in time, to instead be able to assert multiple word line signals at a time. Whilst the required modification to the decoder circuitry could instead have been implemented in the further stage decoding circuitry, it has been found that a particularly efficient and low transistor count solution can be achieved by instead modifying the behavior of the first stage decoding circuitry, and in particular the manner in which the intermediate signals are set by that first stage decoding circuitry. In particular, the circuits implementing the first stage decoding circuitry are typically very small compared with the circuits required to implement the further stage decoding circuitry, and are repeated only a small number of times even for relatively large sized memory devices. By providing a low transistor count solution, this can provide an extra level of secrecy, since the low transistor count makes the added circuitry very difficult to detect by hackers.

There are a number of ways in which the decoder circuitry can be arranged to issue asserted word line signals independently of the clock signal when it is operating in response to the asserted erase signal. In one embodiment, in the absence of said asserted erase signal, timing of operation of the further stage decoding circuitry is controlled by the clock signal, and the decoder circuitry is responsive to the asserted erase signal to control the timing of operation of the further stage decoding circuitry independently of said clock signal. Hence, in such embodiments, the operating of the further stage decoding circuitry is modified so that its operation is clock independent.

There are a number of ways in which the operation of the further stage decoding circuitry can be modified to achieve such clock signal independence. In one embodiment, the decoder circuitry further comprises clock generation circuitry configured, in the absence of the asserted erase signal, to generate an internal clock signal from the clock signal and to provide the internal clock signal to the further stage decoding circuitry. The clock generation circuitry is then responsive to the asserted erase signal to assert the internal clock signal at a predetermined value independent of the clock signal, the further stage decoding circuitry being responsive to the internal clock signal asserted at that predetermined value to generate the asserted word line signal in dependence on the values of the intermediate signals. Hence, in this embodiment, the internal clock signal is effectively deactivated in the presence of the asserted erase signal and replaced by the asserted predetermined value in order to trigger assertion of the necessary word line signals as dictated by the values of the intermediate signals.

There are a number of ways in which the intermediate signals generated by the first stage decoding circuitry can be manipulated in the presence of the asserted erase signal. In one embodiment, the first stage decoding circuitry comprises a plurality of intermediate signal generation blocks, each intermediate signal generation block being configured to receive a plurality of bits derived from the address indication and to generate, in dependence on the plurality of bits, an associated intermediate signal forming one of the plurality of intermediate signals. In response to the asserted erase signal, at least a subset of the intermediate signal generation blocks are configured to set their intermediate signal to a predetermined value irrespective of the received plurality of bits.

There are a number of ways in which each intermediate signal generation block within the above-mentioned subset can be configured to set its intermediate signal to a predetermined value. In one embodiment, each intermediate signal generation block is configured, in the absence of the asserted erase signal, to implement a NAND gate function in order to derive the associated intermediate signal from the received plurality of bits. In response to the asserted erase signal, the at least a subset of the intermediate signal generation blocks are configured to override the NAND gate function in order to set their associated intermediate signal to the predetermined value irrespective of the received plurality of bits. As will be understood, if the NAND gate function receives as it inputs a plurality of bit values, then only if all of those bit values are one will the NAND gate function output a logic zero value. In one particular embodiment, in the presence of the asserted erase signal, the signal generation block is modified so that it outputs as the predetermined value a logic zero value irrespective of the received plurality of bits. This means that many more intermediate signal generation blocks can be arranged to output logic zero values than would be the case during a normal write operation, and this in turn allows multiple asserted word line signals to be issued at the same time in response to the asserted erase signal.

There are a number of ways in which an intermediate signal generation block can be configured to override its normal NAND gate function. In one embodiment, each such intermediate signal generation block comprises a first transistor circuit configured to drive an output of that intermediate signal generation block to the predetermined value in the presence of the asserted erase signal. In the above-mentioned example where the predetermined value is a logic zero value, this can simply be achieved by coupling an NMOS transistor between the output and ground, with the NMOS transistor being driven by the asserted erase signal (in this embodiment the asserted erase signal being asserted at a logic one value).

Further, in one embodiment, multiple of the intermediate signal generation blocks that are configured to override their NAND gate function can be configured to share a second transistor circuit configured to decouple those multiple intermediate signal generation blocks from a supply voltage in the presence of the asserted erase signal. This prevents the NAND gate components from fighting against the action of the above-mentioned first transistor circuit. In one embodiment, the second transistor circuit can take the form of a PMOS transistor coupling the NAND gate structure to the power supply, and driven by the erase signal. Accordingly, when the erase signal is asserted at a logic one value, the PMOS transistor is turned off, decoupling the NAND gate structure from the power supply. The above approach provides a particularly low transistor count solution. For example, in one embodiment, for a particular group of intermediate signal generation blocks, a PMOS transistor can be shared by them all, and each block only needs an NMOS transistor adding to it in order to implement the above functionality. By way of example, for a group of eight intermediate signal generation blocks, the above described functionality can be achieved by the addition of nine transistors.

There are a number of ways in which the operation of the write circuitry can be modified in the presence of the asserted erase signal. In one embodiment, each column of memory cells is coupled to an associated pair of bit lines, and the write circuitry is configured to be responsive to the asserted erase signal to control the voltage levels on the associated bit line pair for each memory cell in said predetermined erase region, such that for each bit line pair one bit line is at a logic 1 voltage level and the other bit line is at a logic 0 voltage level. Whilst for every column the voltages on the bit line pairs can be arranged identically, so that the same value is written into every memory cell across each row, there is no requirement for the same value to be written into every memory cell, and the value can be set separately for each column by appropriate manipulation of the bit line voltages if desired.

In an alternative embodiment, the write circuitry may be configured to be responsive to the asserted erase signal to control the voltage levels on the associated bit line pair for each memory cell in said predetermined erase region, such that for each bit line pair both bit lines are pulled to a voltage level different to a precharged voltage level of the bit lines, in order to cause random data to be written into the memory cells in the predetermined erase region. Hence, purely by way of example, if the precharge voltage level is a logic one level, then both bit lines may be pulled to the logic zero level during the forced write operation. This will effectively randomise the data written into the memory cells within the predetermined erase region, but still is an effective approach for ensuring that the previous contents of those memory cells are no longer available.

The above described techniques can be applied in a wide range of memory devices, for example SRAM memory, dual port memory, flash memory, DRAM memory, a register file (typically formed from 8T SRAM cells), etc.

If the predetermined erase region is large, and in particular if it occupies a significant number of rows within the memory array, then the above-described modified behavior of the decoder circuitry can result in potentially a large number of word lines being asserted at the same time. This can give rise to a large, and easily detectable, in-rush current as the multiple word line drivers within the decoder circuitry activate their corresponding word lines. Such a large draw of current could also potentially affect neighbouring logic around the memory device within a system-on-chip containing the memory device, if it is not well controlled.

In accordance with one embodiment, the operation of the decoder circuitry is further modified in order to limit the in-rush current. In particular, the decoder circuitry is configured to be responsive to the asserted erase signal to treat the word lines associated with the multiple rows within the predetermined erase region as forming a plurality of word line groups, and to stagger in time issuance of the asserted word line signal to the word lines in different word line groups in the plurality of word line groups. By staggering the time at which the word line signals are asserted, this reduces the in-rush current drawn by the word line drivers. As less drivers are activated at the same time, this also allows the word lines to be activated more quickly, which in turn causes the writing of the addressed memory cells to occur more quickly, causing less crowbar current to be consumed within the memory cells. This in turn allows the size of the components within the write circuitry used to control the voltages on the bit lines to be reduced.

Because the word lines are actually activated more quickly when using the above staggered approach, it has been found that the same result can be achieved, in the same period of time, as would be the case if all of the word line drivers were activated at the same time, but the staggered approach results in a much smoother power consumption behavior.

There are a number of ways in which the decoder circuitry can be configured to stagger in time the issuance of the asserted word line signals. As mentioned earlier, in one embodiment the decoder circuitry comprises first stage decoding circuitry configured to generate a plurality of intermediate signals in response to the address indication, and further stage decoding circuitry configured to generate the asserted word line signal in dependence on values of the intermediate signals, and the decoder circuitry is configured to be responsive to the asserted erase signal to set the intermediate signals to values which will cause the further stage decoding circuitry to then issue the asserted word line signal on the word line associated with each row in said predetermined erase region. In such an embodiment, the decoder circuitry may be configured to be responsive to the asserted erase signal to stagger in time the setting of the intermediate signals to said values, in order to cause to be staggered in time the issuance of the asserted word line signal to the word lines in different word line groups in the plurality of word line groups. Hence, in such an embodiment, by staggering in time the setting of the intermediate signals, this ensures that the word line signals are asserted in a staggered manner.

In one particular embodiment where the first stage decoding circuitry comprises a plurality of intermediate signal generation blocks, and at least a subset of those intermediate signal generation blocks are configured, in the presence of the asserted erase signal, to set their intermediate signal to a predetermined value irrespective of the received plurality of bits, the staggering of the generation of the intermediate signals can be achieved by providing delay circuitry within the decoder circuitry to differentially delay propagation of the asserted erase signal to the intermediate generation blocks in said at least a subset.

The delay circuitry can be arranged in a variety of ways. For example, if the intermediate signal generation blocks are considered to form multiple intermediate signal generation groups, the delay circuitry may be configured to differentially delay propagation of the asserted erase signal to the intermediate generation blocks in at least one of those groups. In one particular embodiment, the delay circuitry may be configured to delay propagation of the asserted erase signal to one of the groups, whilst no such delay circuitry is included in the other groups. This allows sets of word lines to be activated at a time, whilst avoiding a situation where all of the required word lines are activated at the same time.

In one particular embodiment, the delay circuitry is configured to delay propagation of the asserted erase signal to every intermediate signal generation block in said at least one of said multiple intermediate signal generation groups. In particular, due to the manner in which the decoder circuitry operates during a normal operation, one intermediate signal generation block in each intermediate signal generation group will be preconditioned to generate the output value that will need to be generated by multiple of those intermediate signal generation blocks in the presence of the asserted erase signal. Hence, with regard to any intermediate signal generation group that is going to be subjected to the above-described delay mechanism, there is no need initially to provide the erase signal to any of the intermediate signal generation blocks in that group, since there will be one arbitrary intermediate signal generation block in that group that is already producing the required output. Hence, by delaying propagation of the asserted erase signal to all of the intermediate signal generation blocks in the relevant intermediate signal generation group, this further smooths the power consumption, and in particular ensures a predictable initial in-rush current when the erase signal is first asserted.

The sizing of the components in the write driver circuitry needs to be such that when the write driver circuitry is controlling the voltages on the bit lines during the erase procedure, it can overcome any counteracting effect produced by the bit cells connected to the relevant column. In the worst case scenario, the write driver circuitry may be seeking to write a first data value into every bit cell in the column, in a situation where every bit cell in the column currently stores a second, opposite, value. In that situation, the write driver circuitry components will need to be strong enough to overcome the counteractive effects that the bit cells will present on the bit lines. In one embodiment, the above-described staggering mechanism can be adapted to assist the writing process, and hence reduce the size of the components required within the write circuitry. In particular, in one embodiment, the decoder circuitry is configured to issue the asserted word line signal to the word lines in a first word line group and to defer issuance of the asserted word line signal to any further word line groups until the forced write operation has been completed in respect of the memory cells of the predetermined erase region that are associated with the first word line group.

By ensuring that when the asserted word line signals are issued to every row in the first word line group, a delay is then introduced sufficient to ensure that the forced write operation is completed in respect of the memory cells associated with that first word line group, this ensures that when the word line signals are asserted for subsequent word line groups, all of the memory cells that have been erased in respect of the first word line group will actually assist the write circuitry in flipping state of the bit cells associated with the remaining word line groups. This hence enables a reduction in the size of the components provided within the write circuitry, whilst still enabling the erase process to be performed efficiently. Further, the reduced size of the components in the write circuitry also ensures that the presence of those components does not adversely impact the operation of the memory device when performing normal read and write operations.

Viewed from a second aspect, the present invention provides a method of operating an apparatus to erase data in a memory device comprising an array of memory cells and configured to operate from a clock signal, the method comprising: responsive to an erase signal in an asserted state, performing a forced write operation independently of the clock signal in respect of each memory cell within a predetermined erase region of said array; maintaining said erase signal in a deasserted state provided that a control signal takes the form of a pulse signal having at least a predetermined minimum frequency between pulses; and issuing said erase signal in said asserted state if the control signal does not take the form of said pulse signal.

Viewed from a third aspect, the present invention provides an apparatus comprising: a memory means comprising an array of memory cell means, the memory means for operating from a clock signal; erase means for performing, responsive to receipt of an erase signal in an asserted state, a forced write operation independently of the clock signal in respect of each memory cell means within a predetermined erase region of said array; and erase signal generation means for receiving a control signal and for maintaining said erase signal in a deasserted state provided that the control signal takes the form of a pulse signal having at least a predetermined minimum frequency between pulses; the erase signal generation means for issuing said erase signal in said asserted state if the control signal does not take the form of said pulse signal.

Viewed from a fourth aspect, the present invention provides a computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device formed by the apparatus in accordance with the first aspect the present invention.

BRIEF DESCRIPTION OF THE DRAWINGS

The present invention will be described further, by way of example only, with reference to embodiments as illustrated in the accompanying drawings, in which:

FIG. 19 illustrates the timing of assertion of the word line signals in accordance with one specific embodiment of the delay mechanism, when compared with the non-delayed approach;

DESCRIPTION OF EMBODIMENTS

Figure 1:
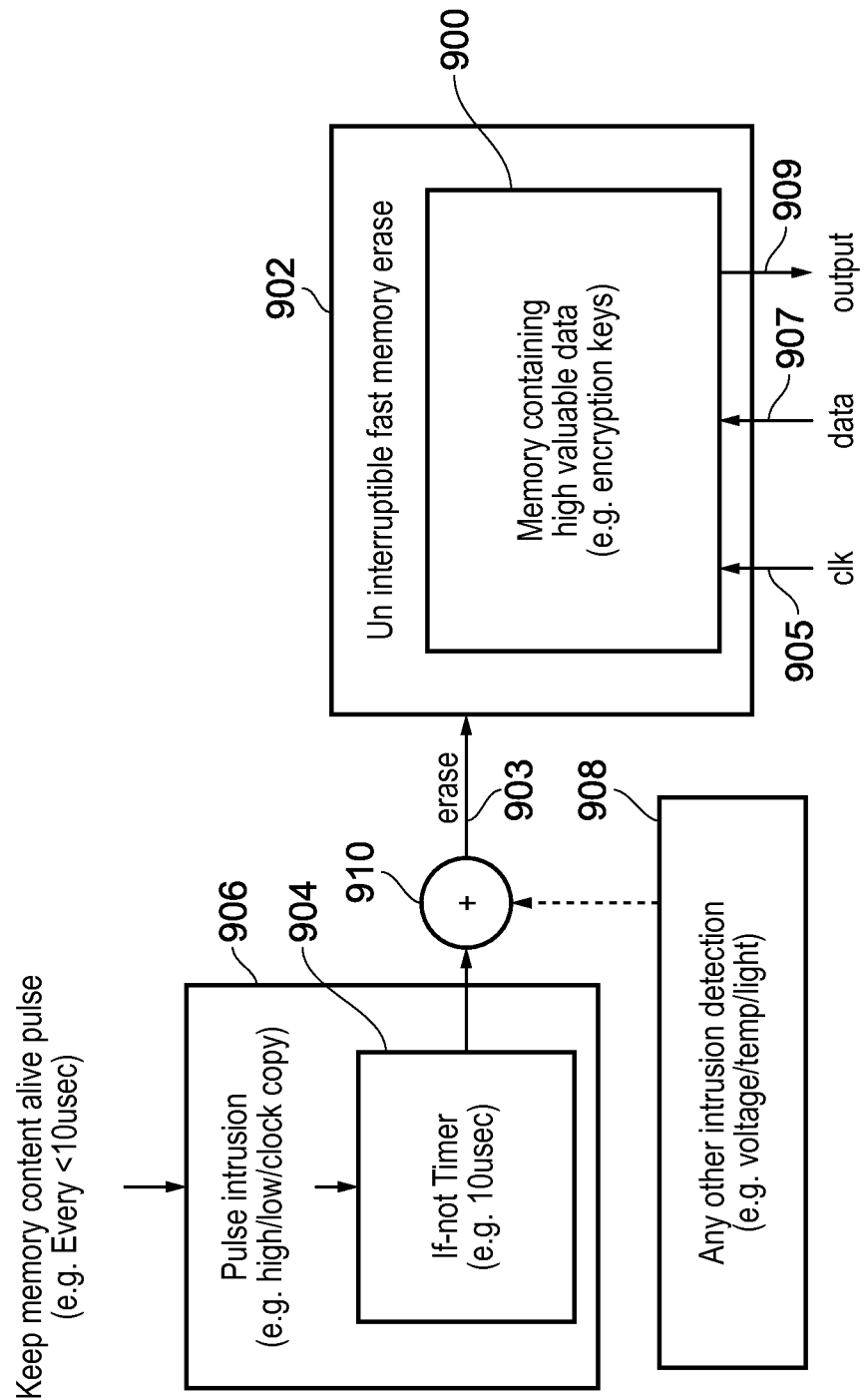
FIG. 1 is a block diagram of an apparatus in accordance with one embodiment.

FIG. 1 is a block diagram of an apparatus in accordance with one embodiment. In accordance with this embodiment, a memory device 900 has uninterruptable fast memory erase circuitry 902 provided in association therewith. This erase circuitry 902 is responsive to receipt of an asserted erase signal over path 903, to perform a forced write operation independently of the clock signal 905 used to operate the memory device 900. Further, the forced write operation occurs in respect of every memory cell within a predetermined erase region of the memory array within the memory device 900. Hence, if a certain predetermined area of the memory is used to store sensitive data, such as encryption keys, that area could be set to be the predetermined erase region. Accordingly, whenever the erase signal is asserted over path 903, that will cause that sensitive data to be overwritten by the fast memory erase circuitry 902. This erase will take place as soon as power is provided to the memory, and cannot be interrupted by seeking to remove the clock signal to the memory over path 905.

The erase write data used to overwrite the contents of the predetermined erase region can take a variety of forms. In some embodiments it may be predetermined, whilst in other embodiments it can instead be generated randomly, or alternatively the data currently presented over path 907 may be written into the memory region. Whatever the form of the erase write data, it will be used to positively overwrite the current data stored in the predetermined erase region.

The uninterruptable fast memory erase circuitry 902 can take a variety of forms, but in one embodiment can be constructed in accordance with one of the embodiments described later with reference to FIGS. 13 to 21. Further, whilst the predetermined erase region may be only a subset of the total memory array, it can alternatively be set to be the entire memory array, so that on assertion of the erase signal over path 903, the entire contents of the memory array are erased.

The erase signal issued over path 903 can be generated in a variety of ways, however, in one embodiment "if-not timer" circuitry 904 is used that receives a control signal which is expected to take the form of a pulse signal having at least a predetermined minimum frequency between pulses, in the illustrative example it being assumed that a pulse will be received at least every ten microseconds. Whilst the control signal does take the form of such a pulse signal, the timer circuitry 904 does not assert the erase signal. However, if the control signal does not take the form of such a pulse signal, either because the control signal stops including a pulse, or the frequency of the pulses reduces below the predetermined minimum, then the erase signal will be asserted over path 903, triggering the erase circuitry 902 to erase the data in the predetermined erase region of the memory array.

Such an approach provides effective protection against the earlier-mentioned cold boot attack, since when the system is turned off during the cold boot attack, this will stop the generation of pulses to the timer circuitry 904. Accordingly, as soon as power is restored, the timer circuitry 904 will assert the erase signal over path 903, which will trigger the erase circuitry 902 to erase the predetermined erase region. Hence, the relevant region of the memory device will be erased as soon as it is reconnected to the power supply, and hence even if the data could have been preserved by the use of low temperatures, as soon as power is reconnected an erase of the relevant data is performed within the memory device, and accordingly the hacker will not be able to obtain the data.

In an optional embodiment, pulse intrusion circuitry 906 can also be provided to detect situations where there may be a potential tampering of the input signal provided to the timer circuitry 904 in an attempt to simulate the required pulse signal in situations where the pulse signal would not naturally be produced. An example of such circuitry will be discussed in more detail later with reference to FIG. 2B and FIG. 9.

As schematically illustrated in FIG. 1, other intrusion detection mechanisms 908 may also be provided for asserting an erase signal, and in the event that any such other intrusion detection mechanisms are provided, their outputs can be multiplexed by the circuitry 910 with the erase signal generated by the timer circuitry 904 in order to produce the erase signal input over path 903 to the erase circuitry 902.

During normal operation where an erase signal is not asserted, the presence of the erase circuitry 902 has no effect of the behavior of the memory device 900, and accordingly data can be written into the memory device 900 over path 907, or read from the memory device over path 909, in accordance with the provided clock signal 905, in the standard manner.

Figure 2A:
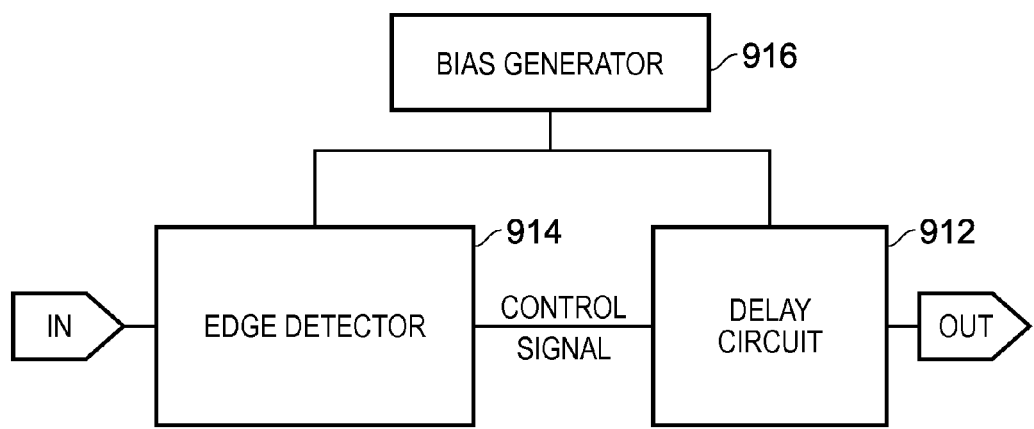
FIG. 2A is a block diagram illustrating components provided within the timer circuitry of FIG. 1 in accordance with one embodiment.

FIG. 2A is a block diagram illustrating components provided within the timer circuitry 904 of FIG. 1 is accordance with one embodiment. A control signal is input to delay circuitry 912. Whilst the control signal takes the form of the earlier described pulse signal having at least a predetermined minimum frequency between the pulses, the output from the delay circuitry 912 will remain de-asserted, i.e. the erase signal will be in a de-asserted state. However, if a situation arises where the pulse signal is no longer present within the control signal, or its frequency drops below the predetermined minimum frequency, then this will trigger the delay circuitry 912 to assert the erase signal.

In one embodiment, the designer of the memory device could be required to generate a suitable control signal for the delay circuitry 912. However, in one embodiment edge detector circuitry 914 is arranged to generate the required control signal based on an input signal that is not required to contain pulses of the required width to causes correct operation of the delay circuitry. In particular, all that is required of the input signal to the edge detector circuitry is that that signal changes its logical state (i.e. from a logic 0 value to a logic 1 value or from a logic 1 value to a logic 0 value) with at least the predetermined minimum frequency at which pulses are required to be included in the control signal.

In one embodiment, as will be discussed in more detail later, a voltage bias generator 916 can be arranged to generate a bias voltage which can be provided to at least certain components within the edge detector 914 and/or the delay circuitry 912 in order to tune the operation of those circuits. In particular, the bias voltage can be used to tune the width of the pulses generated by the edge detector circuitry 914 and/or can be used to vary the rate of change of the voltage at the output of the delay circuitry during a charging or discharging operation of that delay circuitry, as will be discussed in more detail later.

Figure 2B:
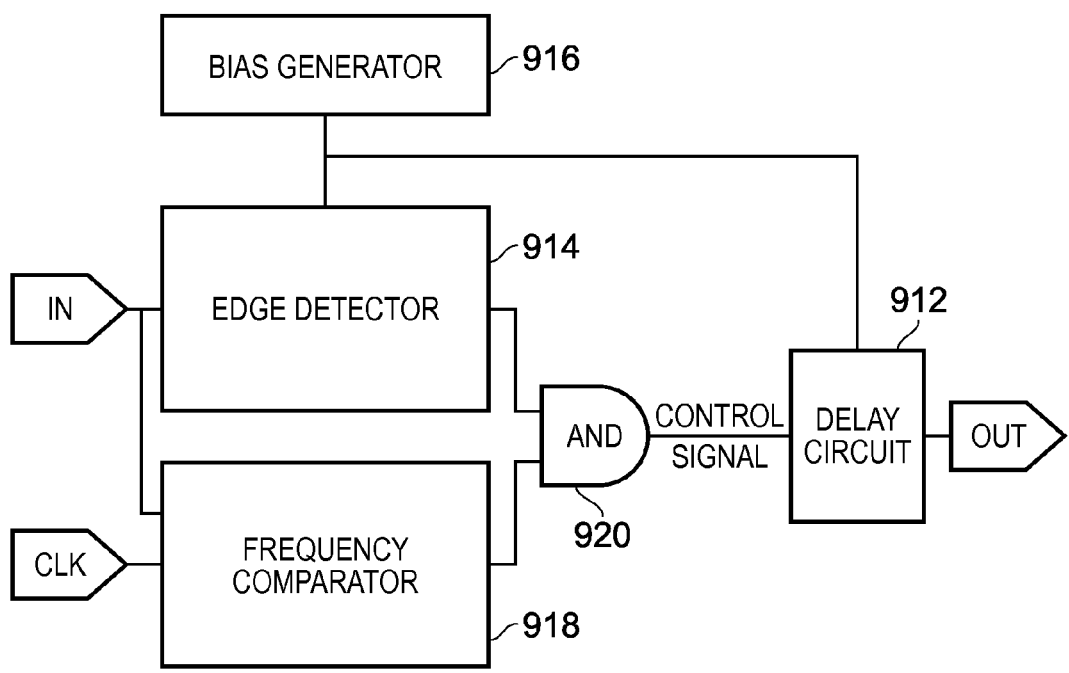
FIG. 2B is a block diagram illustrating components provided within the timer circuitry and pulse intrusion circuitry of FIG. 1 in accordance with an alternative embodiment.

In embodiments where the pulse intrusion circuitry 906 of FIG. 1 provided, then in one embodiment that pulse intrusion circuitry can take the form of the frequency comparator circuitry 918 shown in FIG. 2B. The frequency comparator circuitry 918 effectively provides a pulse override functionality, in that on detection of at least one predetermined condition (in the embodiment shown in FIG. 2B this being a condition that the input signal to the edge detector circuitry 914 has the same frequency as the clock signal provided to the frequency comparator), it prevents the control signal from taking the form of the earlier described pulse signal, and accordingly causes the delay circuitry to assert the erase signal. In particular, whenever the input signal to the edge detector has a different frequency to the clock signal, the frequency comparator circuitry 918 is arranged in the embodiment of FIG. 2B to output a logic one value, hence conditioning the AND gate 920 to output as the control signal the signal that it receives from the edge detector circuitry 914. However, if the frequency comparator circuitry 918 detects that the frequency of the input signal to the edge detector 914 is the same as that of the clock signal, the output from the frequency comparator circuitry transitions to a logic 0 value, hence causing the control signal to take a logic 0 value irrespective of the output from the edge detector circuitry 914. In that event, the delay circuitry 912 will detect the absence of the pulses, and assert the erase signal.

The additional provision of the frequency comparator provides a further level of robustness to attack. In particular, in implementations where a hacker could potentially connect a clock signal to the input of the edge detector in order to seek to cause the desired frequency of pulses to be provided to the delay circuit 912, the frequency comparator could detect such a hacking attempt, and cause the erase signal to be asserted anyway.

Figure 3:
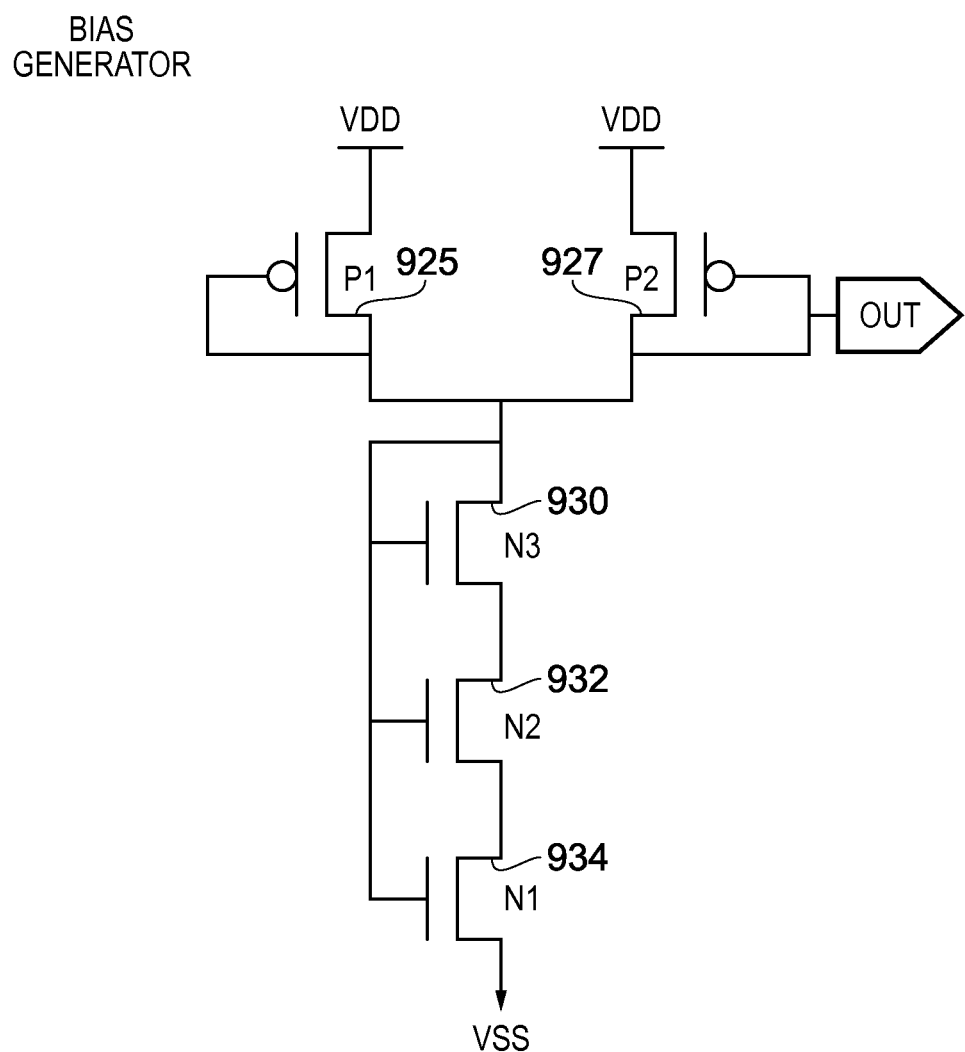
FIG. 3 illustrates the construction of the bias generator in accordance with one embodiment.

FIG. 3 is a diagram illustrating components provided in one embodiment to implement the bias generator circuitry 916 of FIG. 2A or 2B. The series of NMOS transistors 930, 932, 934 limit the current flow. Further, the two PMOS transistors 925, 927 are sized differently and in particular in one embodiment the transistor 925 is arranged to be of the order of ten times bigger than the PMOS transistor 927, hence consuming more current. The small current that flows through the PMOS transistor 927 can then be replicated or even divided using a current mirror, a current mirror being achieved by connecting the output node to the gate of the PMOS transistor 927. Through such an arrangement, the output node will be at a voltage level which, when supplied to PMOS components within the edge detector circuitry 914 and/or the delay circuitry 912, will only partially turn on those PMOS transistors.

Figure 4:
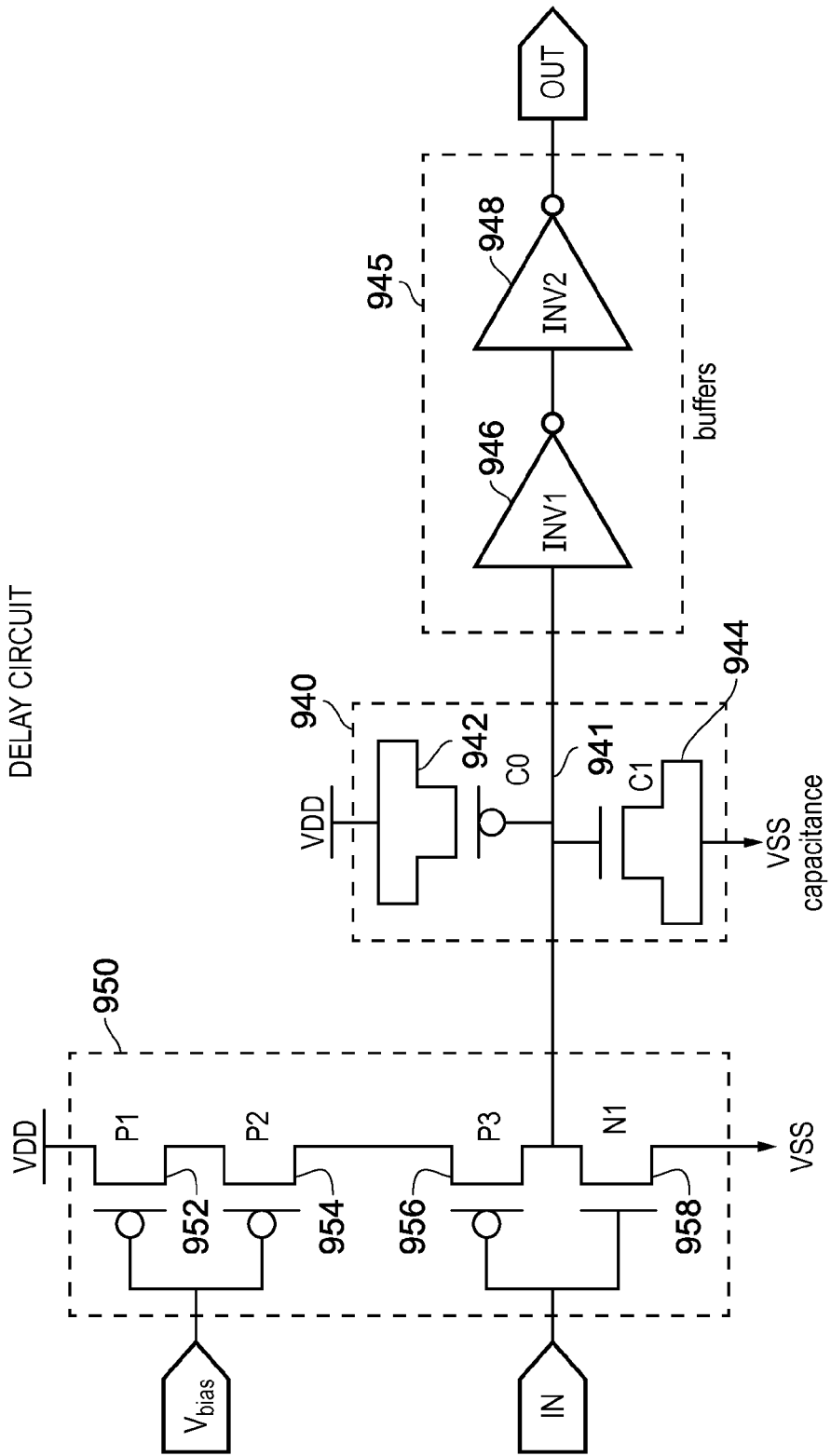
FIG. 4 illustrates the construction of the delay circuit in accordance with one embodiment.

FIG. 4 illustrates components provided in one embodiment to implement the delay circuitry 912 of FIG. 2A or 2B. A current controlled inverter circuit 950 is formed by the series of PMOS transistors 952, 954, 956 and the NMOS transistor 958. The input to the current controlled inverter circuit 950 is the control signal shown in FIGS. 2A and 2B. When a pulse is present in that control signal, a logic one value will be provided at the input, which will turn on the NMOS transistor 958 and turn off the PMOS transistor 956. As a result, the capacitor circuitry 940 formed by the capacitor elements 942, 944 will be subjected to a discharging operation, causing the voltage on the line 941 to be discharged towards ground. In the absence of a pulse, the input to the current controlled inverter circuit 950 will be at a logic zero value, hence turning on the PMOS transistor 956 and turning off the NMOS transistor 958. This will cause the capacitor circuit 940 to be subjected to a charging operation. However, the two PMOS transistors 952, 954 are only partly turned on due to the bias voltage being provided to their gates, and accordingly this limits the current through the PMOS transistor 956, and accordingly limits the speed at which the voltage on line 941 increases during the charging operation.

Output circuitry 945 takes the form of the two inverter circuits, 946, 948. Whilst the voltage on the line 941 is at a level considered by the inverter circuit 946 to be a logic zero level, then this will cause a logic zero level to be output from the delay circuit, i.e. the erase signal will be de-asserted. However, if the voltage on the line 941 ever increases to a point where the inverter circuit 946 views that voltage as being at a logic one level, then a logic one value will be output from the delay circuit, i.e. the erase signal will be asserted.

During normal operation, it is expected that the control signal provided at the input to the current controlled inverter will include pulses having a width, and being received with a frequency, that is sufficient to ensure that regular discharging operations occur, and that the voltage on the line 941 never reaches a level that the inverter circuit 946 interprets as a logic one level. However, where those pulses are removed, or do not occur with the frequency expected, then the voltage on the line 941 will increase to a point where the inverter circuit 946 recognizes a logic 1 value, and at that point the erase signal will be asserted.

Figure 5:
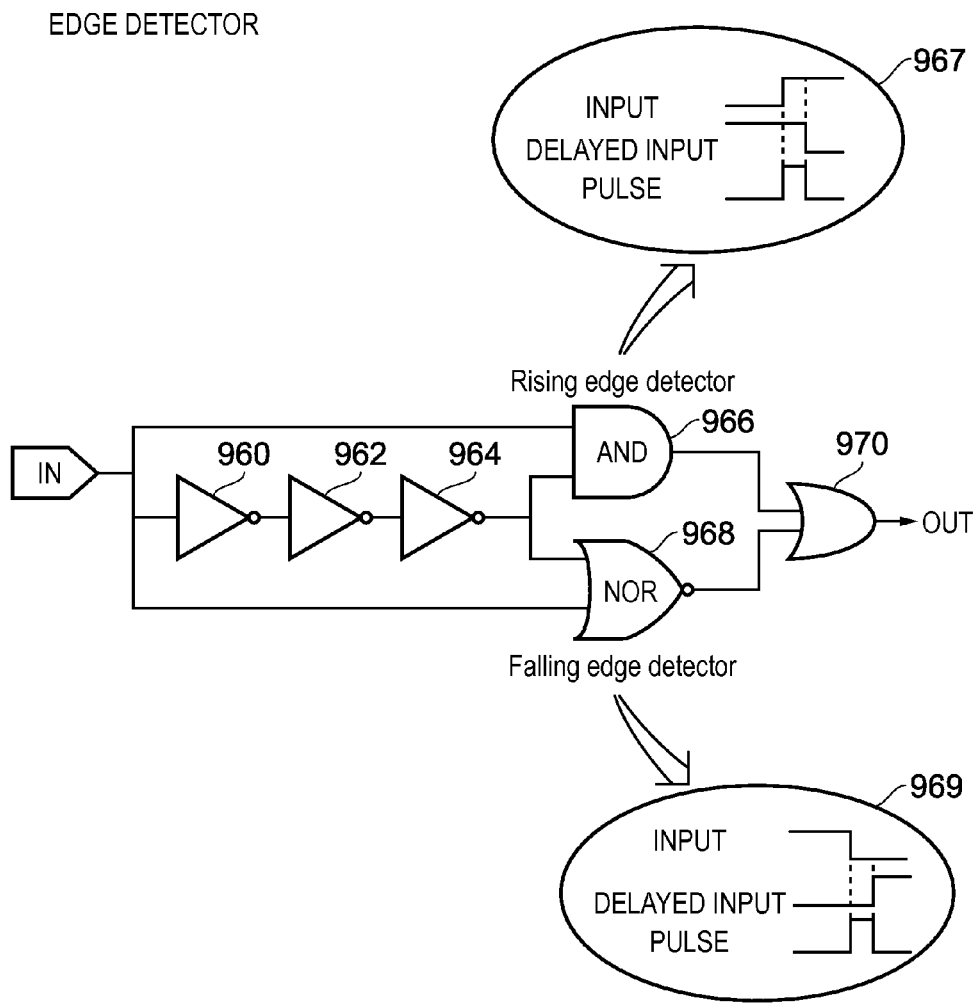
FIG. 5 illustrates the construction of the edge detector in accordance with one embodiment.

In one embodiment, the edge detector circuit 914 takes the form shown schematically in FIG. 5. In particular, the input signal provided to the edge detector is routed as one input to both an AND gate circuit 966 and a NOR gate circuit 968. In addition, a delayed version of the input signal is generated by the series of inverters 960, 962, 964 forming delay circuitry of the edge detector, and that delayed version of the input is provided as the other input to both the AND gate circuitry 966 and the NOR gate circuitry 968. Due to the odd number of inverters in the delay chain, the delayed version of the input signal is also an inverted version of the input signal. As shown by the schematic 967 in FIG. 5, this means that the AND gate 966 will generate a short logic one value pulse on the rising edge of the input signal, with the width of the pulse being dependent on the delay introduced by the delay elements 960, 962, 964. Similarly, as shown by the schematic 969 in FIG. 5, the NOR gate 968 will produce a short logic one value pulse from the falling edge of the input signal, with again the width of the pulse being dependent on the delay introduced by the delay elements 960, 962, 964. The outputs from both the AND gate 966 and the NOR gate 968 can then be logically OR-ed via OR gate circuitry 970 in order to generate the output from the edge detector 914.

The required width for the pulse will depend on how quickly the NMOS transistor 958 within the current controlled inverter circuit 950 of the delay circuitry of FIG. 4 can discharge the capacitance within the capacitor circuitry 940. Typically the NMOS transistor 958 will be arranged to be relatively large so as to avoid leakage during the charging phase of the capacitor under high temperature or certain process corners. However, such an approach does limit the speed at which the capacitance can be discharged by the NMOS transistor in the presence of the asserted pulse.

For example, in one particular implementation, it has been found that to completely discharge the capacitance from a worst case scenario where the capacitance is fully charged, a delay of at least 300 ns is needed. This requires the pulses generated by the edge detector to have a width of 300 ns providing enough time for the capacitance to discharge before the control signal then returns to the logic low level, enabling the charging phase of the capacitance to be resumed.

Figure 6:
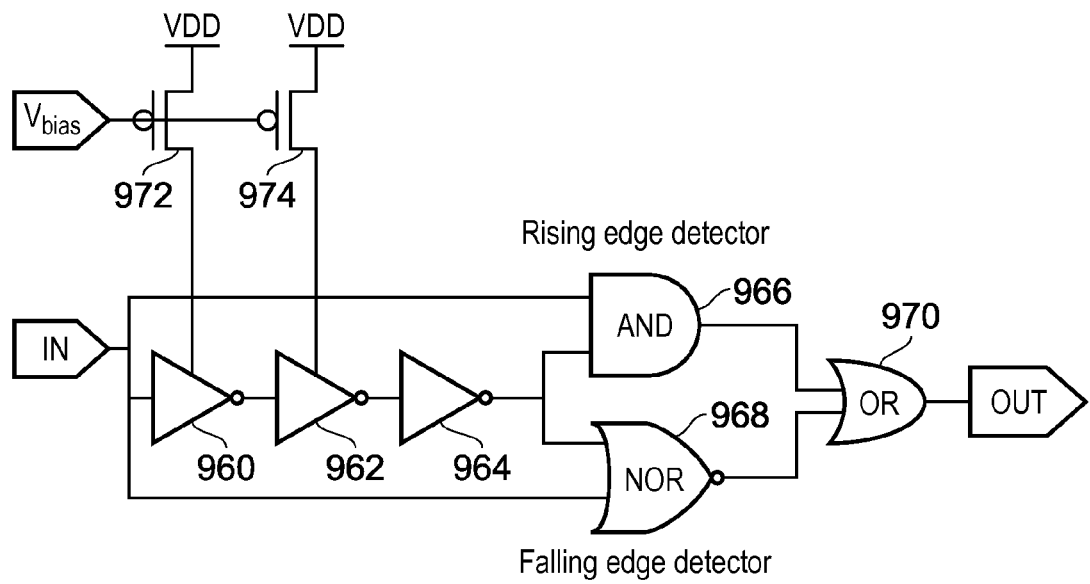
FIG. 6 illustrates the construction of the edge detector in accordance with one embodiment where the delay can be tuned based on the bias voltage produced by the bias generator of FIG. 3.

One technique that can be used to generate a pulse of the desired width is shown in FIG. 6. The circuitry is in essence the same as that shown in FIG. 5, but in addition the two inverters 960, 962 are current controlled inverters, their supply voltage being provided via two PMOS transistors 972, 974 that are arranged to receive the bias voltage generated by the bias voltage generator of FIG. 3. Since that bias voltage causes the PMOS transistors 972, 974 to only partially be turned on, the inverter circuits 960, 962 are driven by a voltage that is less than Vdd. The bias voltage can hence be selected so as to cause the required delay to be introduced by the delay chain 960, 962, 964.

Figure 7:
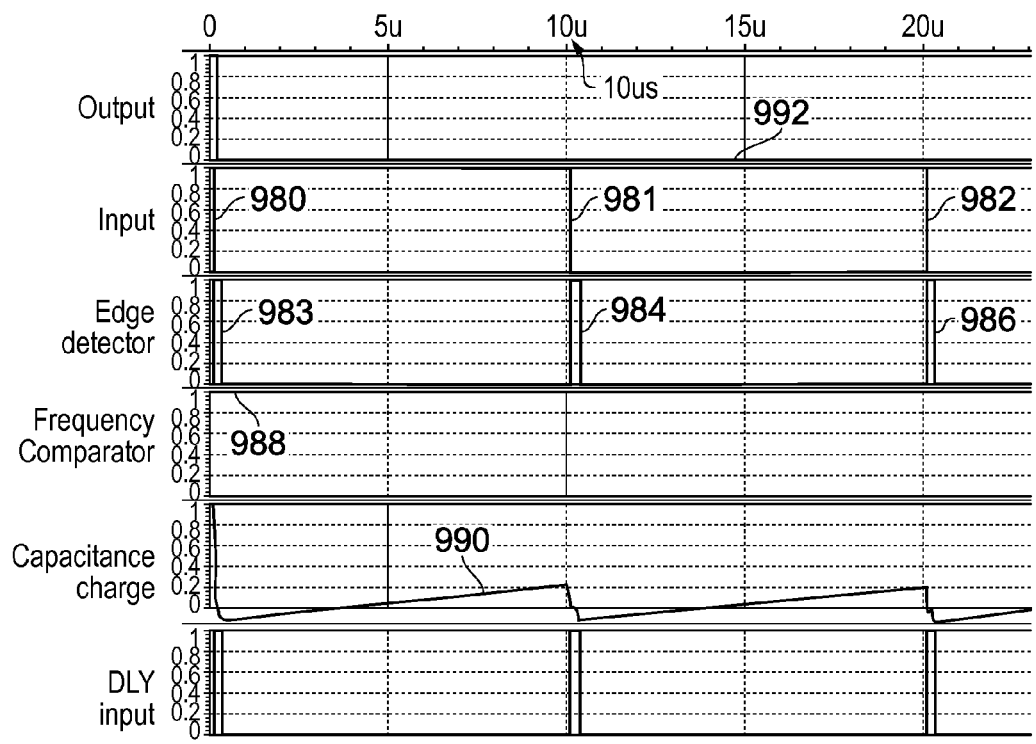
FIGS. 7 and 8 are timing diagrams illustrating the operation of the circuitry in accordance with one embodiment.
Figure 8:
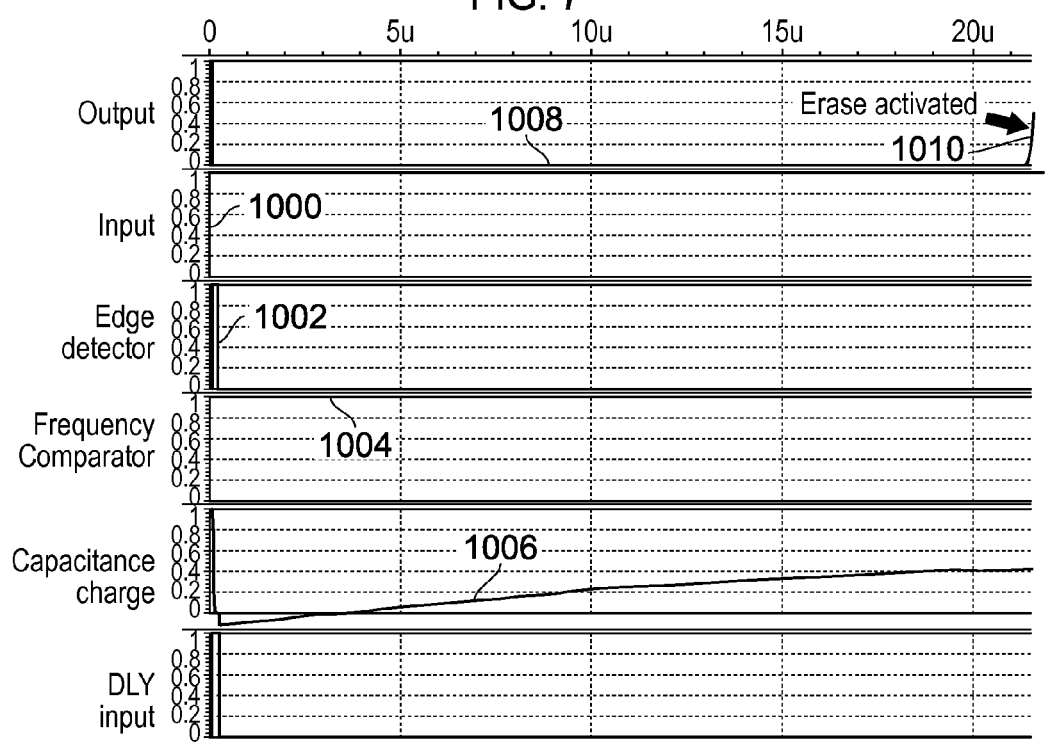

FIGS. 7 and 8 illustrate the operation of the edge detector 914 and delay circuitry 912 described earlier, for a situation where regular pulses are generated by the edge detector, and for a situation where regular pulses are not generated, respectively. In this example, it is assumed that the delay circuitry requires a pulse to be received at least every 10 microseconds. In FIG. 7, this is the case, in that the input signal to the edge detector 914 transitions every 10 microseconds, as shown by the transitions 980, 981, 982. This causes the edge detector to generate the associated pulses 983, 984, 986. As shown by the capacitance curve 990, each time the pulse is asserted, it causes the capacitance to be discharged, with the capacitance then starting to charge in the intervening period between pulses. Since the pulses appear at least every 10 microseconds, the capacitance never reaches a voltage level that the inverter circuitry 946 of FIG. 4 recognizes as a logic one level, and accordingly the output 992 is maintained in the de-asserted state, i.e. the erase signal is not asserted. In this example, it is assumed that the output 998 from the frequency comparator (if provided) is always at a logic one value, and accordingly has no effect on the control signal provided to the delay circuitry. Accordingly the signal "DLY input" used as the control signal input to the delay circuit 912 is formed directly by the output of the edge detector 914.

In contrast, when considering FIG. 8, a situation arises where following a pulse 1002, no further pulses are produced by the edge detector. This is due to the fact that the input signal transitions at point 1000, but does then not include any further transitions for at least a period of time shown in FIG. 8. As a result, the capacitance steadily increases as shown by the path 1006, until a point is reached where the voltage is interpreted by the inverter circuitry 946 as being at a logic one value, this causing the output signal 1008 to transition to a logic one value at point 1010, i.e. at this point the erase signal is asserted. Again, the frequency comparator output 1004 is considered to be at a logic one value for the duration of time illustrated in FIG. 8, and accordingly has no effect on the operation of the circuitry.

Figure 9:
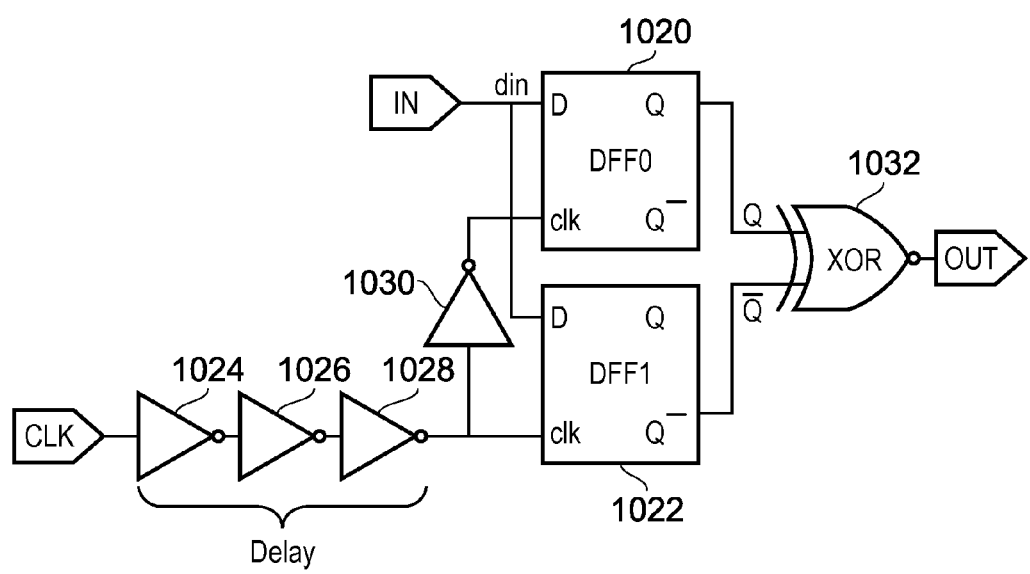
FIG. 9 illustrates the construction of the frequency comparator of FIG. 2B in accordance with one embodiment.

FIG. 9 is a diagram illustrating the frequency comparator circuitry 918 of FIG. 2B in accordance with one embodiment. The frequency comparator circuitry detects if the input signal provided to the edge detector 914 has the same frequency as the clock signal provided to the frequency comparator, which in one embodiment may be the system clock signal. The circuitry comprises a first D-flip flop 1020 and a second D-flip flop 1022. The clock signal is provided to the first flip flop 1020 via the delay chain of inverters 1024, 1026, 1028 and the final inverter 1030. In contrast, the second flip flop 1022 receives an inverted version of the clock signal via the delay chain of inverters 1024, 1026, 1028. The input provided to the edge detector is also provided as an input to both of the flip flops 1020, 1022. On a rising edge of the clock signal, the first flip flop 1020 outputs the current input value to one input of the exclusive OR (XOR) gate 1032. Further, on a rising edge of the inverted clock signal, the second flip flop 1022 outputs an inverted version of the input to the other input of the XOR gate 1032. As will be understood, the XOR gate 1032 will output a logic one value whilst both of its inputs are different, and will output a logic zero value whenever the outputs are the same.

Figure 10:
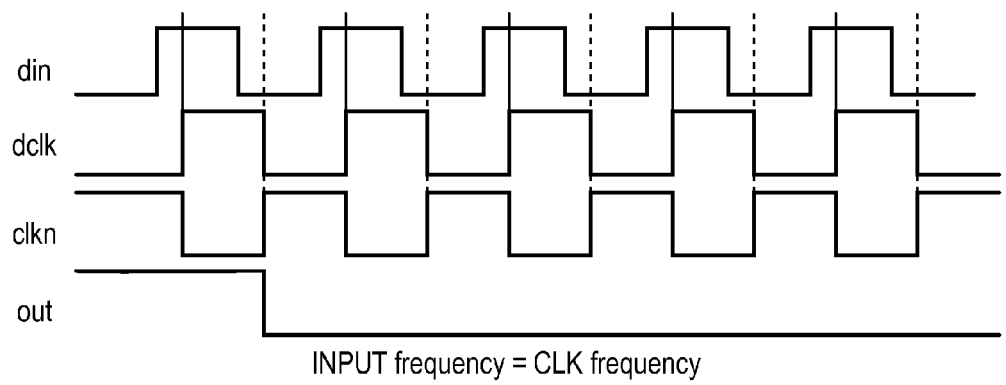
FIGS. 10 and 11 are timing diagrams illustrating the operation of the frequency comparator of FIG. 9 in accordance with one embodiment.

As shown in FIG. 10, this means that if the input signal provided to the edge detector is merely generated by connecting the clock signal, then the input signal will have the same frequency as the clock signal, and will repeatedly cause both of the inputs to the XOR gate to have the same value. In particular, on the rising edge of the clock signal dclk the first flip flop 1020 will output a logic one value. On each rising edge of the inverted clock signal clkn the second flip flop will also output a logic one value, since it outputs the inverse of the current input value. Accordingly, it will be appreciated that as soon as the clock signal is provided as the input signal to the edge detector, the frequency comparator will detect that the edge detector input signal is of the same signal frequency as the clock signal, and will accordingly output a logic zero value, causing the AND gate 920 of FIG. 2B to output a logic zero value as the control signal, and thereby cause the erase signal to be asserted.

Figure 11:
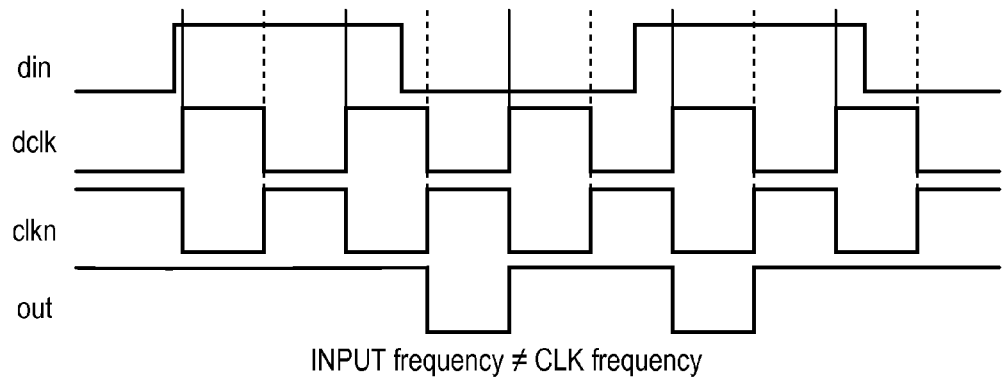

In contrast, as shown in FIG. 11, in the normal situation where the input to the edge detector has a frequency which is different to the clock signal, the outputs produced by the two flip flops will typically be different, and accordingly the output from the XOR gate will predominantly be at the logic one value. Occasional blips will occur where the output form the XOR gate temporarily drops to a logic zero value, but typically these blips will be very short lived (half a clock cycle in the example shown in FIG. 11) and accordingly will have no appreciable effect on the operation of the delay circuitry 912.

When using D-flip flops in any design, set up and hold time should be taken into consideration. Since a hacker may be able to access the clock tree of the memory, he/she could, by trial and error, find the clock node that causes set up or hold violations, thereby effectively blocking the erase operation by preventing the erase signal from being asserted. To counter such a hacking attempt, a delay is introduced by the delay elements 1024, 1026, 1028 for the clock signal provided to both flip flops. This added delay guarantees that the clock will always be triggered later than the input to the edge detector, in situations where the hacker intends to use a clock signal to provide the input to the edge detector, hence avoiding such a circumvention of the erase mechanism.

From the above described embodiments, it will be appreciated that a mechanism is provided whereby a regular pulse is required to keep the contents of the predetermined erase region "alive". If the pulse is not present, timer circuitry asserts an erase signal, which causes an uninterruptable fast memory erase mechanism to erase the data in that predetermined erase region. This provides enhanced protection for that data against hacking attempts, such as a cold boot hacking attempt. In one embodiment, the timer circuitry 904 is placed close to the memory 900 and associated erase circuitry 902, and ideally is provided in the same IP block as the memory device.

Figure 12:
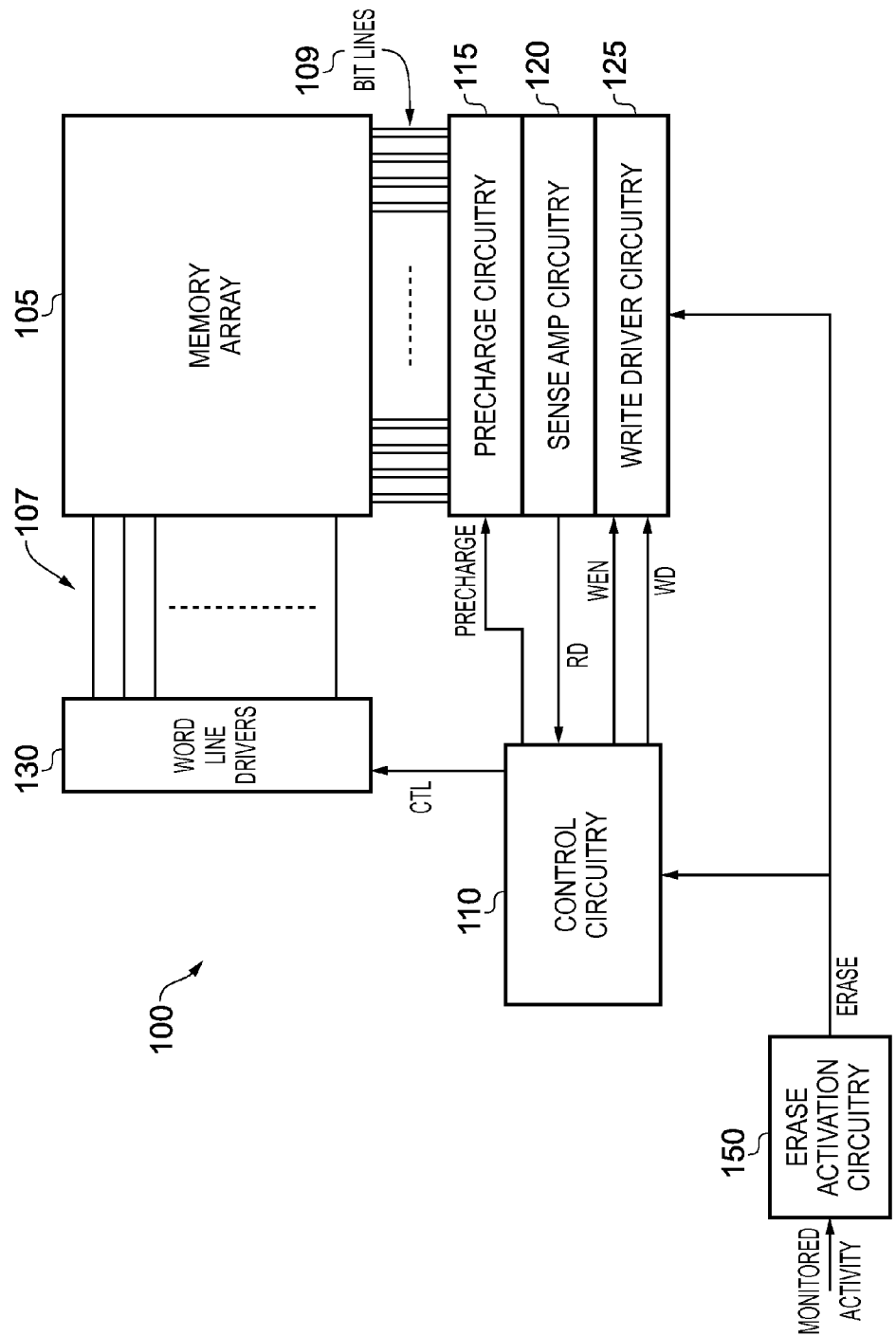
FIG. 12 is a block diagram schematically illustrating a memory device in accordance with one embodiment.

FIG. 12 is a diagram schematically illustrating a logical arrangement of a memory device in accordance with one embodiment. In particular, the memory device 100 includes a memory array 105 comprising an array of memory cells arranged in a plurality of rows and columns. A plurality of word lines 107 are provided through the array in order to allow individual rows of memory cells to be addressed by the word line drivers 130 during write and read operations. In addition, a plurality of bit lines 109 are provided in association with the columns of memory cells. In one embodiment, each column is coupled to a pair of bit lines to enable data to be written into an activated memory cell of the column during a write operation, and for data to be read from an activated memory cell of the column during a read operation.

Precharge circuitry 115 is used to precharge the voltage level on the bit lines under the control of control circuitry 110. Following the precharge operation, a write operation or read operation can be performed. For a write operation, the control circuitry 110 will issue control signals to the word line drivers 130 in order to cause a particular row of memory cells to be activated via the associated word line, and the control circuitry 110 will further cause the write driver circuitry 125 to control the voltages on the relevant bit line pairs, in order to cause the required data values to be written into the memory cells of the activated row. For a read operation, again the control circuitry 110 will issue control signals to the word line drivers 130 in order to cause a particular row of memory cells to be activated via the appropriate word line, and the sense amplifier circuitry 120 will then be used in order to evaluate the voltages on the relevant bit lines, with the sensed read data then being returned to the control circuitry 110.

As will be discussed in more detail with reference to the remaining figures, in accordance with the described embodiments the control circuitry 110 and write driver circuitry 125 are modified so that in response to an asserted erase signal the control circuitry performs a modified decode operation which causes the word line driver circuitry 130 to assert a word line signal on the word line associated with each row in a predetermined erase region. The asserted erase signal also causes the write driver circuitry to control the voltage level on the bit lines for each memory cell in the predetermined erase region in order to cause erase write data to be written in to the memory cells of the predetermined erase region. Further, as will be discussed, this modified operation occurs independently of the clock signal, and hence will occur even if the clock signal is removed from the memory device.

As shown in FIG. 12, erase activation circuitry 150 is configured to monitor certain activity within the system incorporating the memory device in order to detect occurrence of a predetermined condition, and on occurrence of that predetermined condition is arranged to assert the erase signal to both the control circuitry 110 and the write driver circuitry 125. The activity that is monitored will depend on the implementation. For example, in a security implementation, the erase activation circuitry 150 may monitor for activity indicative that a processing device has finished utilising secure data stored in the memory array, and when that condition is observed it may then assert the erase signal to cause that sensitive data to be erased from the memory device. Alternatively, the erase activation circuitry may monitor for activities indicative of an attempted hacking operation, and in that instance assert the erase signal. In non-security based applications, other activity may be monitored, for example an activity that indicates that multiple rows in the memory array need clearing, with the erase signal then being asserted to provide an efficient mechanism for erasing the data in the predetermined erase region without the need for the processing device to issue a series of separate write operations to overwrite the data in each row of the predetermined erase region. In one embodiment, the erase activation circuitry employs the delay circuitry, edge detector circuitry, bias generator circuitry, and optionally frequency comparator circuitry, as discussed earlier with reference to FIGS. 1 to 11.

The techniques of the described embodiments can be used in a wide variety of memory devices, for example an SRAM memory, a dual port memory, a flash memory, a DRAM memory, a register file, etc.

The erase activation circuitry 150 may be provided externally to the memory device, or in one embodiment can be provided internally within the memory device.

Whilst FIG. 12 is intended to logically illustrate the arrangement of the memory device, it will be appreciated that it is not intended to provide an indication of the structural arrangement. For example, the sense amplifier circuitry 120 may actually be embedded within blocks forming the memory array, as may the precharge circuitry 115.

Figure 13:
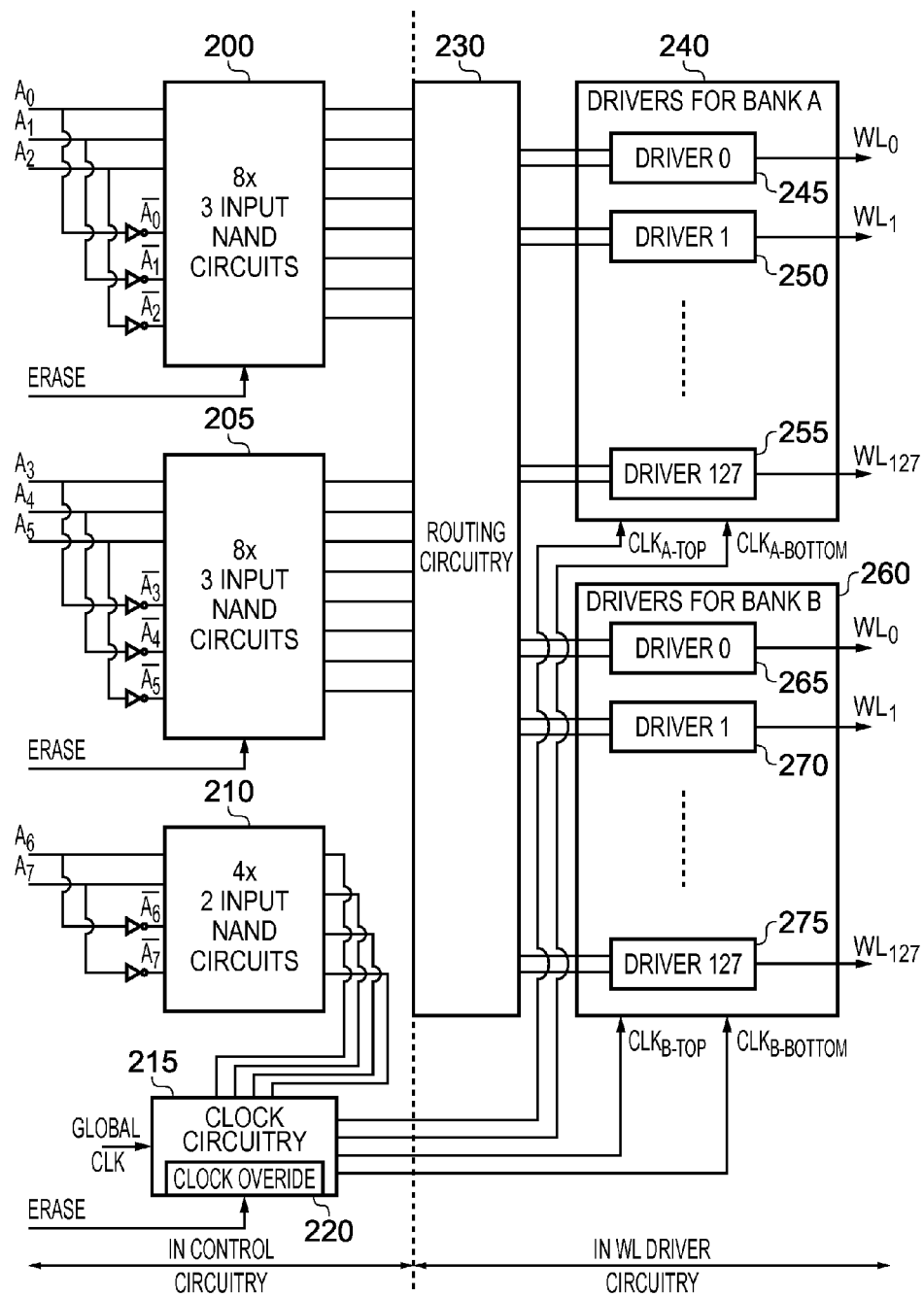
FIG. 13 is a block diagram illustrating in more detail the construction of the control circuitry and word line driver circuitry of FIG. 12 in accordance with one embodiment.

FIG. 13 is a block diagram illustrating in more detail components provided within the control circuitry 110 and the word line driver circuitry 130 of FIG. 12 to perform a decoding operation in accordance with one embodiment. As can be seen from FIG. 13, the decoding operation is split into two separate stages. In particular, a first stage decoding operation (also commonly referred to as a pre-decode operation) is performed within the control circuitry using the pre-decode circuits 200, 205, 210, 215. Thereafter, a further decode stage is performed within the word line drivers of the word line driver circuitry 130, in the embodiment shown these word line drivers 245, 250, 255, 265, 270, 275 being logically grouped into a first group 240 associated with a first bank within the memory array and a second group 260 associated with a second bank in the memory array. For the purposes of the present invention, it does not matter whether the memory array is partitioned into separate banks, and if it is partitioned, it does not matter how many banks it is partitioned into.

Each of the pre-decode circuits 200, 205, 210, comprises a plurality of intermediate signal generation blocks. In particular, the circuit 200 is arranged to receive three bits of a received address, along with the inverse values of those address bits, and includes eight intermediate signal generation blocks each configured to receive a predetermined three of the received six values and to generate a corresponding intermediate signal for passing to the routing circuitry 230 (in this embodiment the routing circuitry being considered to be provided within the word line driver circuitry 130). Each intermediate signal generation block effectively implements a NAND function, but as will be discussed in more detail later with reference to the remaining figures at least some of those NAND circuits are modified slightly to enable the NAND function to be overridden in the presence of an asserted erase signal.

The pre-decode circuit 205 is arranged in the same way as the circuit 200, the circuit 205 receiving a further three address bits and the inverted versions of those address bits, and generating a further eight intermediate signals for routing to the routing circuitry 230. Again, one or more of the NAND circuits within the pre-decode circuitry 205 may be modified in order to override the NAND functionality in the presence of an asserted erase signal.

As shown in FIG. 13, the pre-decode circuitry 210 consists of four two input NAND circuits, and the pre-decode circuitry 210 receives a further two address bits and the inverted versions of those address bits. The outputs from the pre-decode circuit 210 are not provided directly to the routing circuitry, but instead are provided as a sequence of bank select signals to the clock circuitry 215. In particular, in this embodiment it is assumed that each of the two banks A and B are actually addressable in two halves, referred to as top and bottom halves, and accordingly the four outputs from the pre-decode circuitry 210 are used to identify which of those four possible regions is to be addressed. During a normal operation, if the relevant output from the pre-decode circuit 210 is asserted at a logic one value, then on the rising edge of the global clock signal, an asserted clock signal will be issued to the corresponding group of word line drivers associated with the top or bottom section of bank A or bank B being addressed. However, as will be discussed in more detail later with reference to the remaining figures, the clock circuitry is provided with a clock override function 220 which, on receipt of an asserted erase signal, will override such functionality in respect of at least one of the four sections, and will instead issue an asserted signal over the relevant clock path irrespective of the input received from the pre-decode circuit 210, and irrespective of the state of the global clock signal.

Figure 14:
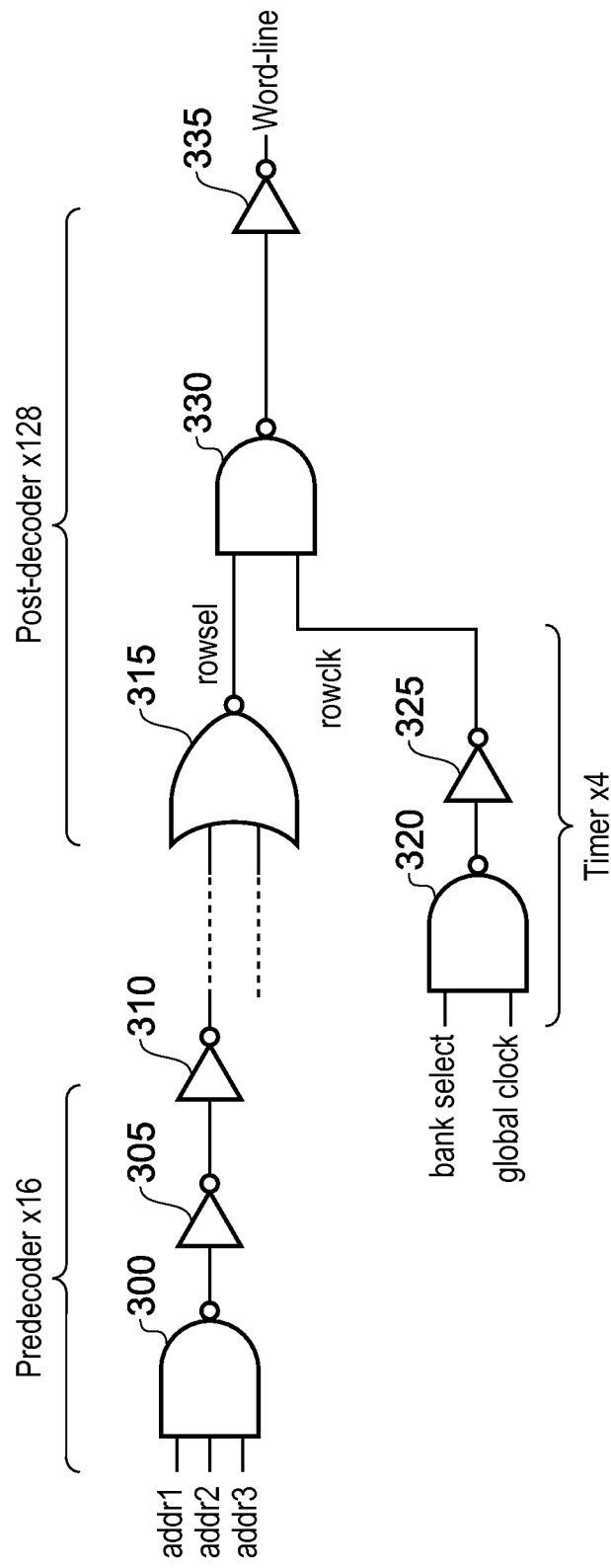
FIG. 14 illustrates a known approach for splitting the decoding operation into a pre-decode stage performed by the control circuitry and a post-decode stage performed within the word line driver circuitry.

FIG. 14 schematically illustrates components that may be provided within the circuitry of FIG. 13 in accordance with a conventional approach, where the circuitry is not modified to accommodate the asserted erase signal and associated functionality. In particular, within each of the pre-decode circuits 200, 205, each intermediate signal generation block may comprise a NAND circuit 300 and two inverter circuits 305, 310. As will be understood, only when the associated three address bits provided as an input to that NAND gate circuit are at a logic one value, will the NAND gate issue a logic zero value, and accordingly only in that particular situation will a logic zero value ultimately be output from the inverter 310. During a normal operation, only one intermediate signal generation block within the pre-decoder circuit 200 and one intermediate signal generation block within the pre-decoder circuit 205 will receive three logic one inputs, and accordingly only those two intermediate signal generation blocks will output a logic zero value.

The routing circuitry 230 routes different pairs of the intermediate signals to each of the various word line driver circuits 245, 250, 255, 265, 270, 275. Due to the two sets of eight intermediate signals generated by the pre-decode circuits 200, 205, this gives rise to 64 possible combinations, and hence typically four of the 256 word line drivers will receive a pair of inputs that are both at a logic zero value.

However, the pre-decode circuitry 210 will also be arranged such that only one of its outputs will be at a logic zero value, and accordingly via the clock circuitry, only one of the four clock signal paths will be asserted. Accordingly, only one of the word line driver circuits will receive both two logic zero inputs from the routing circuitry, and an asserted clock signal, and accordingly during normal operation only one of the word line signals will be asserted.

The operation of the clock circuitry 215 is shown in FIG. 14 by the components 320, 325. In particular, the clock circuitry will replicate the components 320, 325 for each of the four inputs from the pre-decode circuitry 210. As discussed earlier, only one of the output signals from circuitry 210 will be at a logic zero value. Bank select signals are determined from the inverse of those output signals and hence only one bank select signal will be at a logic one value. Accordingly, on a rising edge of the global clock signal, the relevant NAND gate 320 will receive two logic one input values and will hence output a logic zero value, thus causing the inverter 325 to output a logic one value to the NAND gate 330.

Each of the word line driver circuits 245, 250, 255, 265, 270, 275 includes the components 315, 330, 335. However, as mentioned earlier, four word line driver circuits will receive the same combination of two intermediate signals from the routing circuitry, and accordingly the NOR gate 315 can be shared between those four drivers. As will be appreciated, only when the two input signals to the NOR gate 315 are both at a logic zero value will a logic one value be output as the row select signal from that NOR gate. Given the earlier described functionality of the clock circuitry, it will be appreciated that only a single one of the word line drivers 245 will hence receive at its NAND gate 330 two logic one input values, and accordingly only that word line driver will then output from its NAND gate 330 a logic zero value, which will in turn cause an asserted word line signal to be issued from the inverter 335 at a logic one value.

Figure 15:
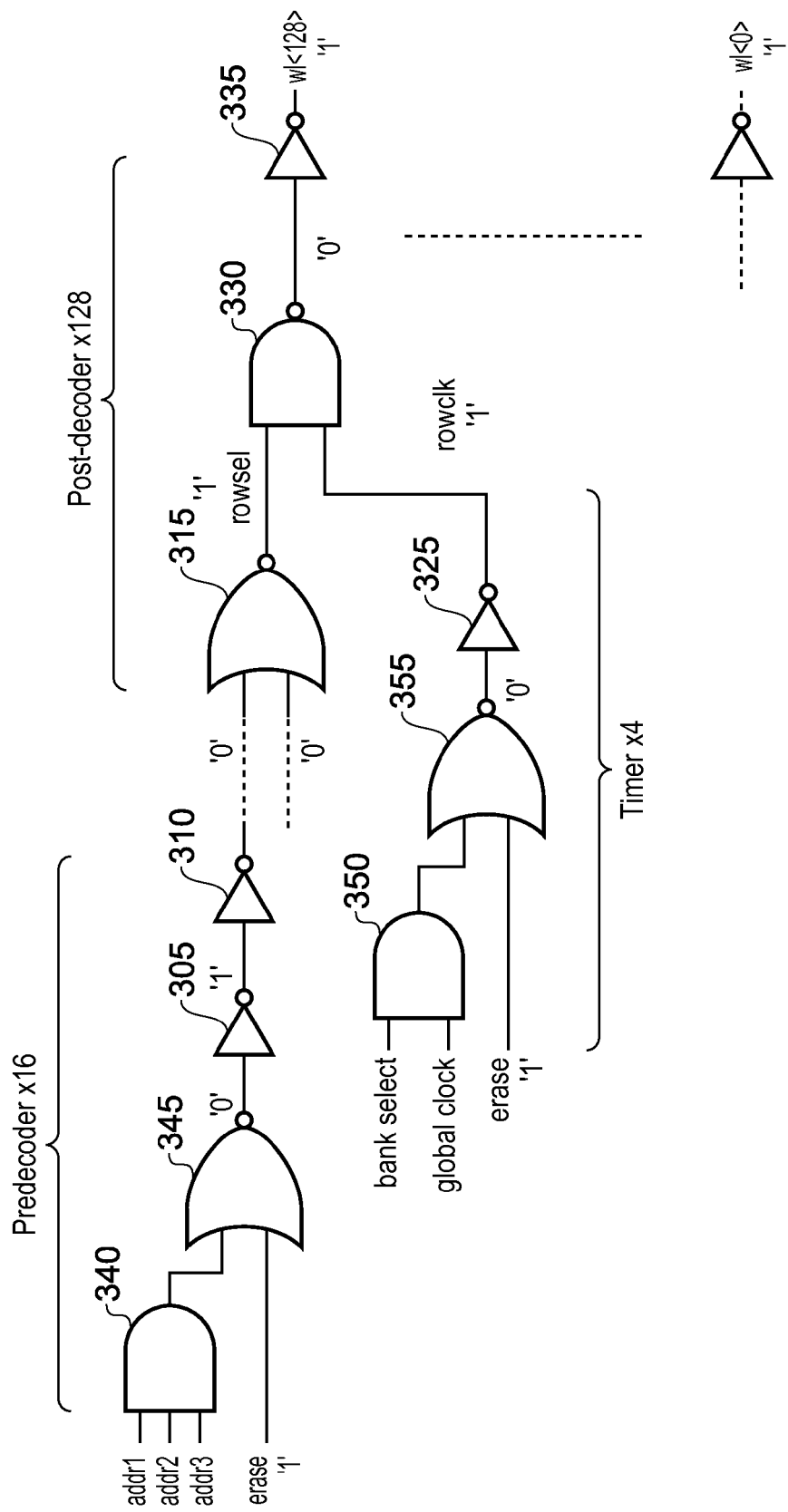
FIG. 15 illustrates how the circuitry of FIG. 14 can be adapted in accordance with one embodiment to enable a forced write operation to be performed within a predetermined erase region of the memory device.

In accordance with the described embodiments incorporating the erase functionality, at least some of the intermediate signal generation blocks within the pre-decode circuits 200 and 205 are modified as shown in FIG. 15. In particular, the standard NAND gate 300 is replaced with an AND gate 340 and a NOR gate 345. During normal operation where the erase signal is unasserted, it will be appreciated that this hence implements exactly the same function as the NAND gate circuit 300. However, when the erase signal is asserted this causes the output of the NOR gate 345 to change to a logic zero value irrespective of the three address inputs to AND gate 340, which in turn causes a logic zero value to be output from the inverter 310. Where multiple of the intermediate signal generation blocks are modified in this manner, this causes multiple of the intermediate signals to be issued at a logic zero value, and this in turn means that multiple of the NOR gates 315 within the word line driver circuits can be arranged to receive two logic zero values. This hence enables multiple word lines to be activated at the same time.

Similar circuitry will also be incorporated within at least one of the clock circuits within the clock circuitry 215. Accordingly, the NAND gate function 320 of FIG. 14 is replaced by an AND gate 350 and NOR gate 355. When the erase signal is unasserted, this hence does not affect the operation of the clock circuitry, but when the erase signal is asserted, this effectively overrides the global clock signal, and causes a logic zero value to be output from the NOR gate 355, which in turn causes a logic one value to be output from the inverter 325. For the corresponding section of the memory array (i.e. the top part or the bottom part of bank A or the top part or the bottom part of bank B) this will mean that all of the word line drivers will be primed to assert their word line signal in the event that their associated NOR gate 315 receives two logic zero values.

It will hence be seen that this approach enables multiple word lines to be asserted at the same time, and in a clock independent manner. This hence provides a very efficient mechanism for overwriting data within a predetermined erase region of the memory array. The exact configuration of the predetermined erase region can be determined by deciding which of the various intermediate signal generation blocks within the pre-decoders 200, 205 and which of the clock circuits within the clock circuitry 215 to modify in accordance with the circuitry of FIG. 15. For example, if all 16 intermediate signal generation blocks within the pre-decoders 200, 205 are modified as shown in FIG. 15, and all of the four clock circuits within the clock circuitry 215 are also modified as shown in FIG. 15, it will be seen that this will cause all of the word lines in both banks to be asserted in the presence of an asserted erase signal, hence causing the entire memory array to be erased. However, there is no need to erase the entire memory array, and by limiting the clock modification circuitry to a subset of the four clock circuits within the clock circuitry 215, the erase operation can be restricted to a particular bank and indeed to a particular top or bottom half of the bank. Further, not all of the rows of memory cells within that selected portion of the memory array need to be erased, and instead this can be configured dependent on which of the 16 intermediate signal generation blocks within the pre-decode circuits 200, 205 are modified in the manner shown in FIG. 15.

Figure 16:
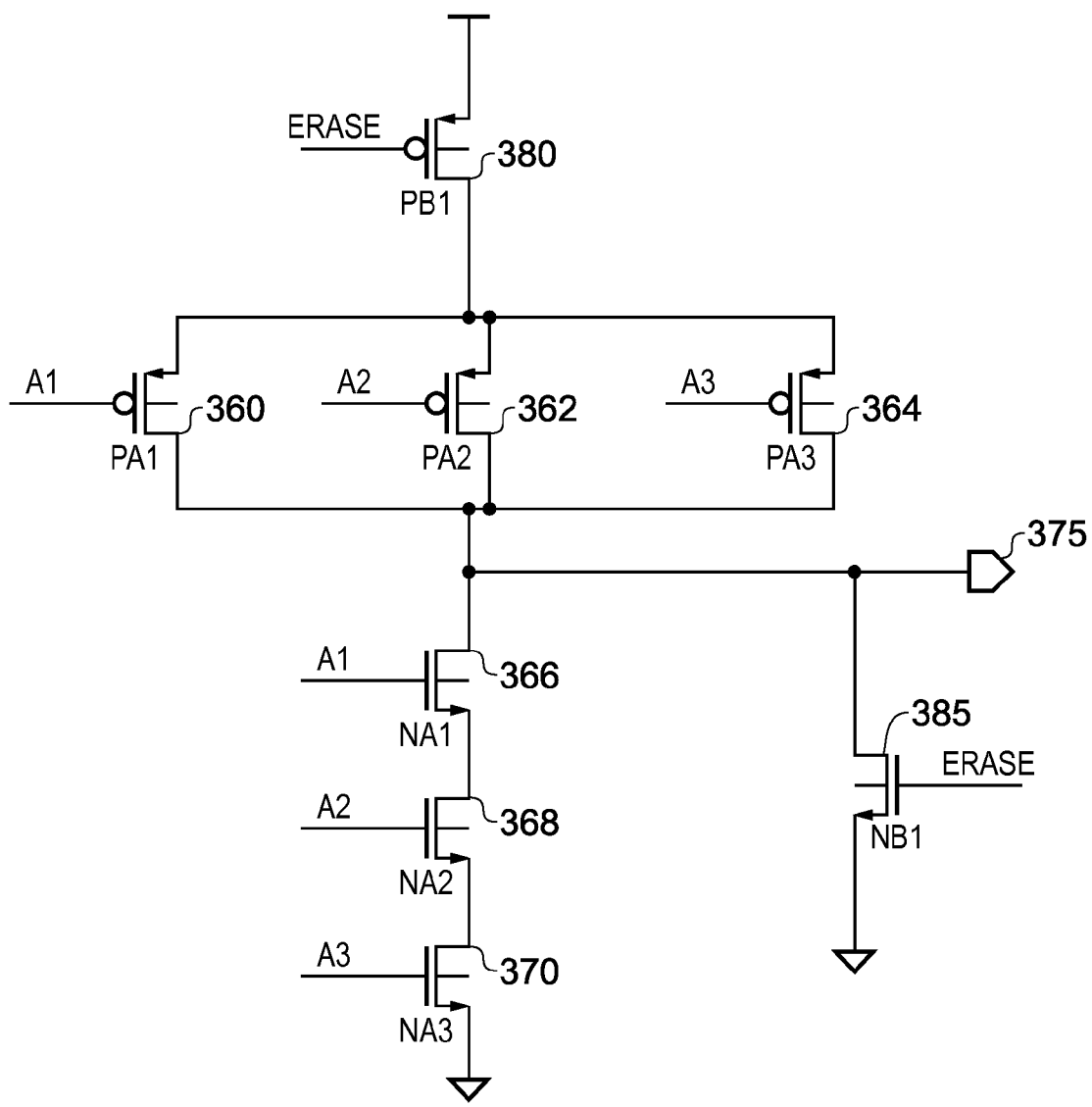
FIG. 16 illustrates how the NAND gate structure within the pre-decoder of FIG. 14 may be modified in order to implement the modified function of FIG. 15 in accordance with one embodiment.

FIG. 16 shows an efficient mechanism for modifying a NAND gate structure to produce the structure 340, 345 or 350, 355 of FIG. 15. In particular, the basic NAND circuit comprises three PMOS transistors 360, 362, 364 in parallel, coupled to three NMOS transistors 366, 368, 370 in series. Each PMOS transistor receives a corresponding one of the three address inputs, as do each of the three NMOS transistors. To modify the NAND gate structure, an NMOS transistor 385 is coupled between the output node 375 over which the intermediate signal is output, and a ground potential, with that NMOS transistor being driven by the erase signal. In addition, a PMOS transistor 380 is coupled between the power supply and the parallel configuration of PMOS transistors 360, 362, 364, this PMOS transistor also being driven by the erase signal. In the absence of an asserted erase signal, it will be seen that the PMOS transistor 380 is turned on and the NMOS transistor 385 is turned off, and accordingly the circuitry operates as a standard NAND gate. However, when the erase signal is asserted, the PMOS transistor 380 turns off, decoupling the NAND gate structure from the power supply. In addition, the NMOS transistor 385 turns on, discharging the output node 375 to ground (i.e. a logic zero value).

Whilst in one embodiment a separate NMOS transistor 385 will be provided in association with each of the intermediate signal generation blocks, in one embodiment the PMOS transistor 380 is shared amongst all of the intermediate signal generation blocks within a particular pre-decode circuit 200, 205 whose function is to be modified by the erase signal. Hence, if all eight of the intermediate signal generation blocks within a particular pre-decode circuit 200, 205 are to be modified, then it will be seen that a total of nine additional transistors (eight NMOS transistors and one PMOS transistor) needs to be added to the pre-decode circuitry. This provides a particularly small increase in gate count, which makes the presence of this modification circuitry very difficult to detect, hence further improving security.

Figure 17:
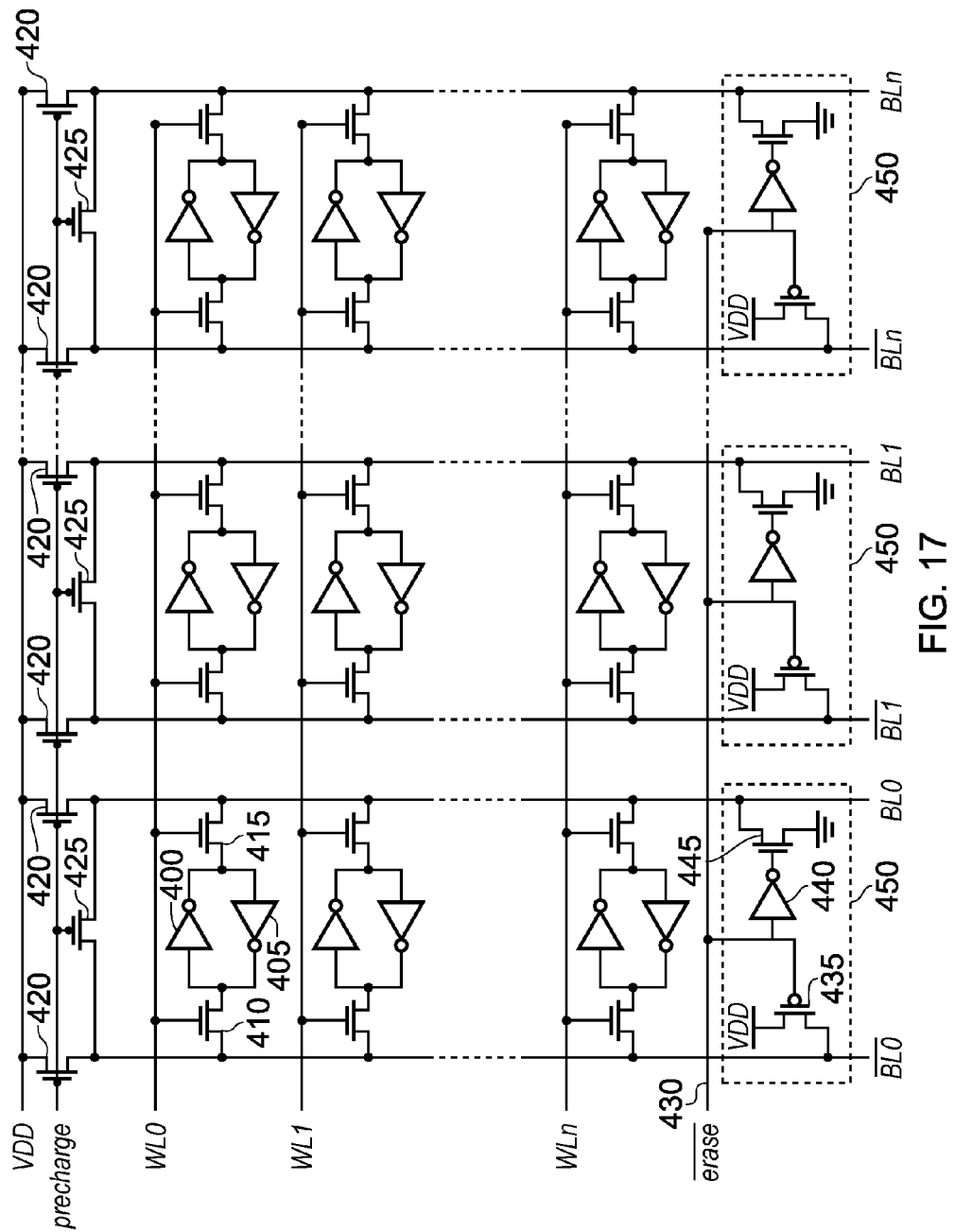
FIG. 17 illustrates components that can be provided within the write driver circuitry of FIG. 12 in accordance with one embodiment to control the voltage on the bit lines in the presence of an asserted erase signal, in accordance with one embodiment.

FIG. 17 illustrates how the write driver circuitry 125 may be modified to control the voltages on the bit lines in the presence of an asserted erase signal. In this example, it is assumed that the memory array 105 comprises an array of 6T SRAM memory cells, each 6T SRAM memory cell comprising a pair of inverters 400, 405, and two NMOS transistors 410, 415. During a normal write operation, one of the word line signals would be asserted, turning on the NMOS transistors 410, 415 for each memory cell in the row associated with that asserted word line signal. This hence couples the pair of inverters 400, 405 to the bit lines, and enables the data value to be written into each of the addressed memory cells dependent on the value present on each of the bit lines. As shown, precharge circuitry 420 is used to precharge each of the bit lines to a logic one voltage level prior to a write operation. The PMOS transistors 425 are also considered to form part of the precharge circuitry, and ensure that both bit lines are coupled together during the precharge operation, thereby ensuring that exactly the same voltage is present on the bit lines of each bit line pair at the end of the precharge operation. Following the precharge operation, the precharge signal is de-asserted to a logic one level, hence turning the precharge transistors 420, 425 off. At this point, the write driver circuitry 125 will pull the voltage on one bit line of each bit line pair to a logic zero value, in order to cause the required data value to be written into the addressed memory cells.

As shown in FIG. 17, in one embodiment the write driver circuitry also includes some additional components to control the voltages on each bit line pair in response to an asserted erase signal. In particular, when the erase signal is asserted at a logic one value, the inverted erase signal provided over path 430 will be at a logic zero value. This will cause the PMOS transistor 435 in each circuit block 450 to turn on, thereby retaining the left hand side bit line at the logic one value. Similarly, via the inverter 440, this will cause the NMOS transistor 445 to turn on, hence pulling the voltage on the right hand side bit line of each bit line pair down to a logic zero value. This will hence cause the same value (for example a logic zero value) to be written into each memory cell connected to an asserted word line. As discussed earlier, when the erase signal is asserted, multiple word lines can be activated at the same time, and accordingly this can cause the same value to be written into a large number of memory cells in a very short period of time.

FIG. 17 is merely provided as one example of how the write driver circuitry can be modified to respond to the asserted erase signal. However, there is no requirement that every block 450 is configured in the same way, nor indeed is there any requirement that the two bit lines in each bit line pair are pulled in opposite directions. For example, in one embodiment the blocks 450 can be configured to pull both bit lines in each bit line pair to the logic zero value, which will effectively mean that random data is stored in each of the memory cells connected to an asserted word line. However, this is still sufficient to ensure that whatever data was previously stored in those memory cells has now been overwritten and can no longer be accessed, hence preventing a hacker from taking advantage of the earlier described remanence effects. In another embodiment, the write driver circuitry 125 can merely be arranged to store into each row receiving an asserted word line signal the data values currently present on its input pins.

Whilst the above described embodiments provide a very efficient and effective mechanism for overwriting multiple rows of the memory array within the predetermined erase region, they can give rise to a significant in rush current being drawn by the word line driver circuits. In particular, the final inverter circuits 335 provided in each word line driver circuit are typically quite large, and if a large number of those are turned on simultaneously, this will give rise to a large, and easily detectable, in rush current being drawn by the word line driver circuitry 130. When a larger number of the word lines are asserted at the same time, the transition of each word line from the unasserted to the asserted state will occur more slowly than would be the case when a single word line is asserted. This means that it will take longer for the addressed memory cells to be written to, and this can increase the crowbar current, and in turn require the sizing of the write driver components within the blocks 450 to be increased.

Figure 18A:
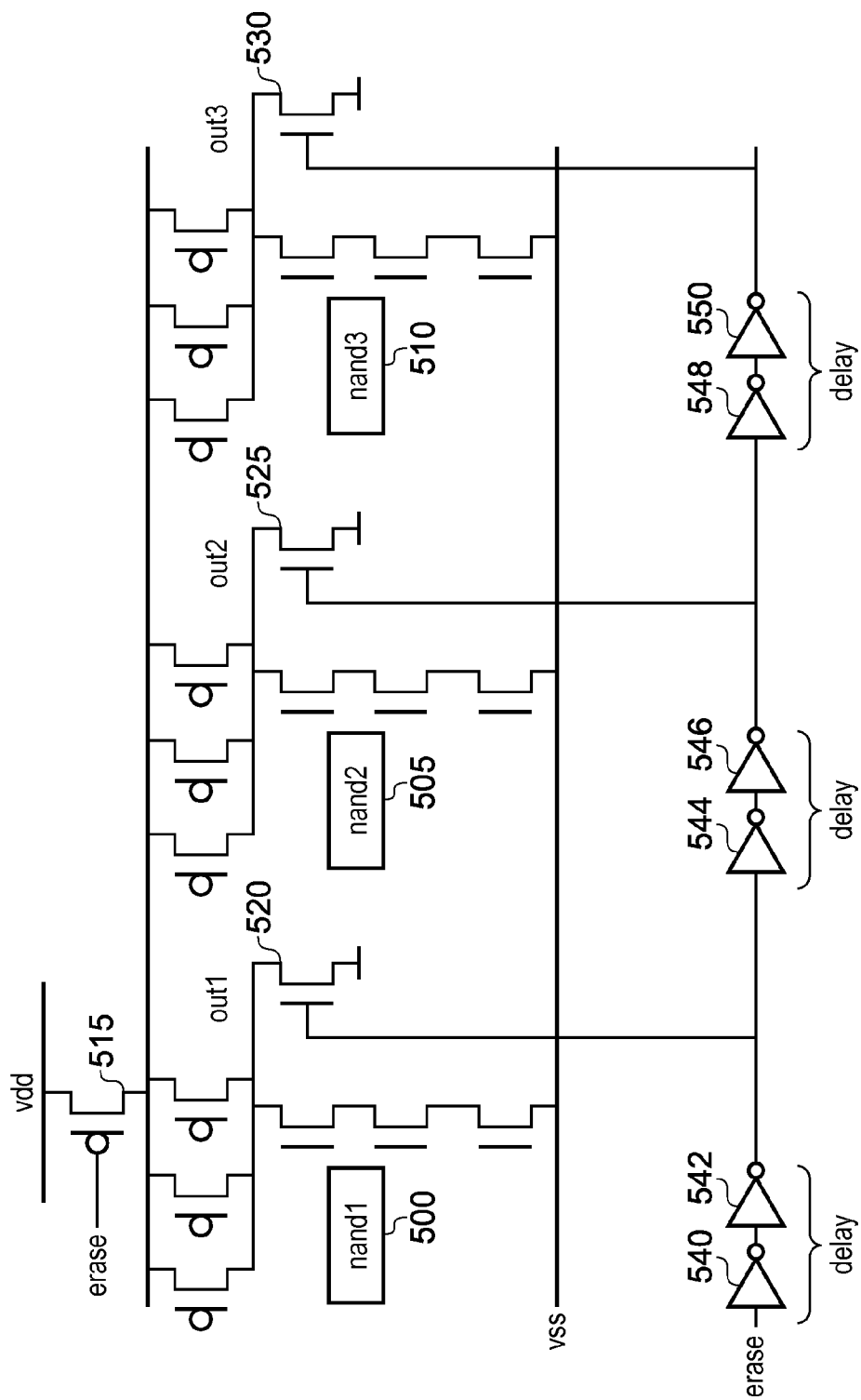
FIG. 18A illustrates how a delay may be introduced in the propagation of the asserted erase signal to a sequence of modified NAND gate structures, in accordance with one embodiment.

FIG. 18A illustrates a staggered delay mechanism that can be used to alleviate these issues. In particular, within at least some of the intermediate signal generation blocks modified as shown in FIG. 15, the timing of the propagation of the asserted erase signal to the NOR gates 345 is staggered, such that the timing of the transition of the intermediate signals to a logic zero value is staggered. This in turn will stagger the timing at which the word lines are asserted, thereby reducing the in rush current. Hence, as shown in FIG. 18A, for those intermediate signal generation blocks within a particular pre-decode circuit 200, 205 that are to be responsive to the erase signal, the timing of the transmission of that erase signal to those intermediate signal generation blocks is staggered. Hence, each of the basic NAND gate circuits 500, 505, 510 is modified as discussed earlier with reference to FIG. 16 by the addition of a separate NMOS transistor 520, 525, 530 for each signal generation block, but with the signal generation blocks sharing the PMOS transistor 515. The erase signal is provided immediately to the PMOS transistor, but is delayed before being provided to the NMOS transistors. Further, due to the delay elements 540, 542, 544, 546, 548, 550, each NMOS transistor 520, 525, 530 receives the erase signal at a different time. Hence, output 1 will transition to the logic zero value before output 2, and output 2 will transition to the logic zero value before output 3.

Figure 18B:
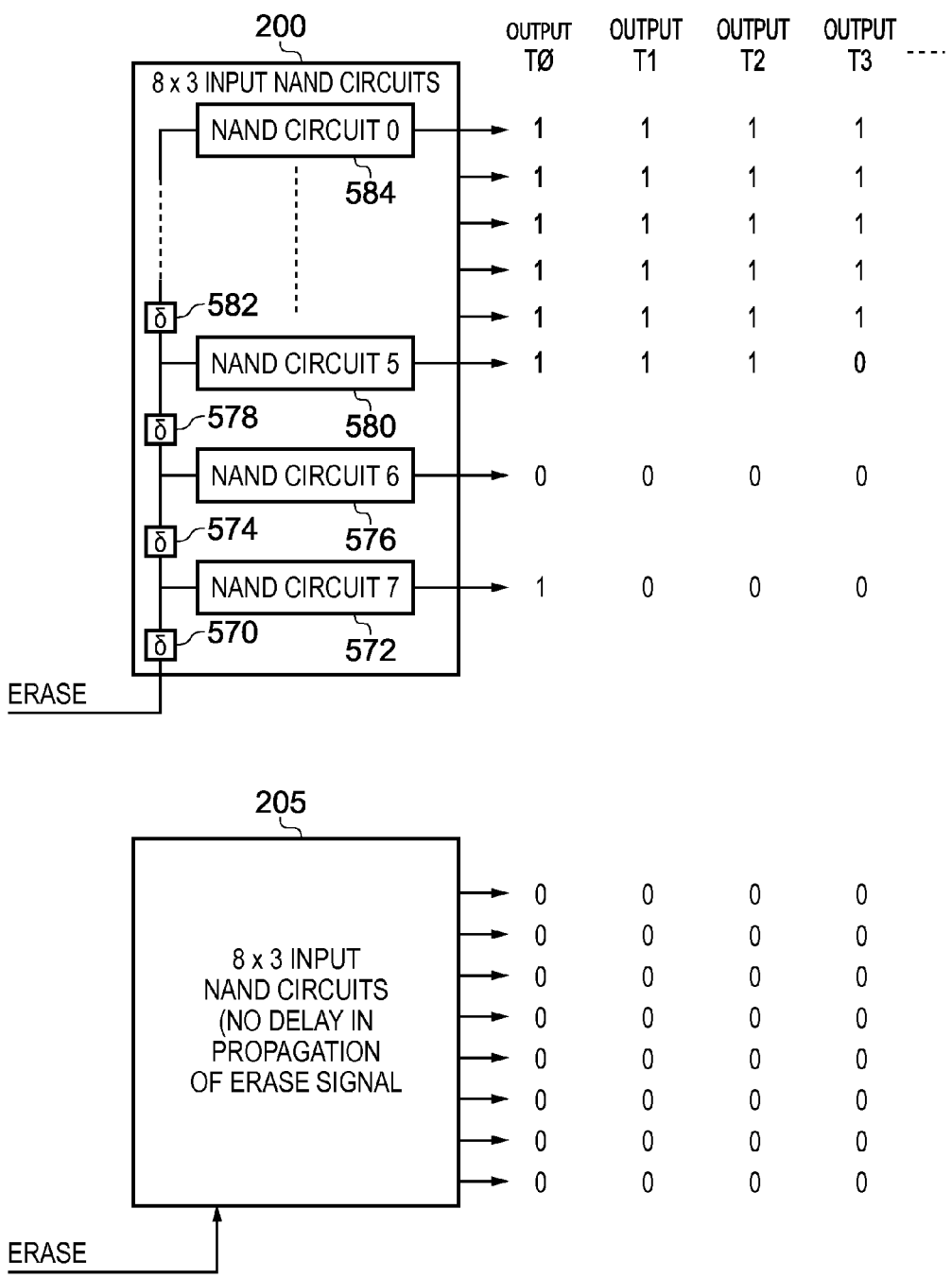
FIG. 18B illustrates in further detail how the delay mechanism of FIG. 18A may be used in one embodiment.
Figure 20:
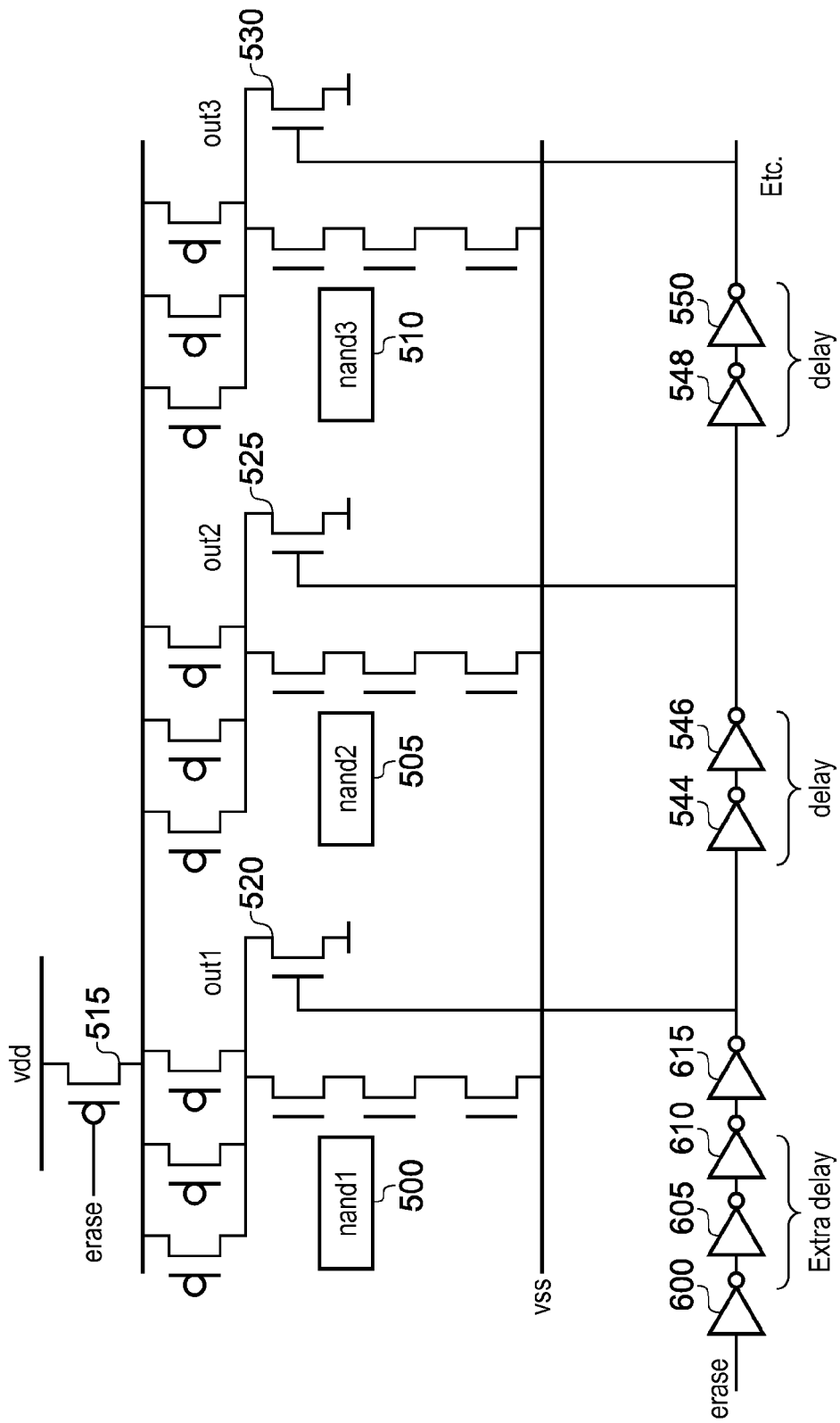
FIG. 20 illustrates a modified version of FIG. 18A, where the length of the initial delay is increased in order to ensure that the forced write operation is completed in respect of a first block of memory cells within the predetermined erase region, prior to the remaining memory cells being subjected to the forced write operation, in order to provide a write assist mechanism in accordance with one embodiment.

Whilst it is not essential to delay the transmission of the erase signal to the first NMOS transistor 520, an additional benefit can be realized by doing so, as will be illustrated schematically with reference to FIG. 18B. In the example of FIG. 18B, it is assumed that all sixteen intermediate signal generation blocks within the pre-decode circuits 200, 205 are modified as shown in FIG. 15. However, the eight intermediate signal generation blocks within the pre-decode circuitry 205 do not have the erase signal delayed, and accordingly as soon as the erase signal is asserted, the output intermediate signals from those eight blocks transition to a logic zero value.

In contrast, for each of the eight intermediate signal generation blocks 572, 576, 580, 584 within the pre-decode circuit 200, an associated delay element 570, 574, 578, 582 ensures that the propagation of the erase signal is delay differentially before being supplied to each of those blocks. Due to the earlier described operation of the pre-decode circuitry in a normal mode of operation (i.e. where the erase signal is de-asserted), it will always be the case that the output from one of the NAND circuits is at a logic zero value, with the remaining outputs being at a logic one value. However, which one is outputting a logic zero value will depend entirely on the last provided input to the pre-decode circuitry 200. By using the initial delay element 570, advantage can be taken of the fact that one of the outputs is already at a logic zero value to ensure that the number of word lines that are asserted initially is always the same, and a relatively small number. In particular, as shown, at time 0, NAND circuit 6 576 will output a logic zero value but all of the other NAND circuits within the pre-decode circuitry 200 will output a logic one value. Combined with the eight logic zero values output from the pre-decode circuitry 205, this will mean that 32 word lines (i.e. $\frac{1}{8}^{th}$ of the total word lines) will be activated at time 0 for the configuration shown in FIG. 13.

At time 1, it is assumed that NAND circuit 7 572 has now received the asserted erase signal, and accordingly has transitioned its output to a logic zero value. As a result, another 32 word lines will be selected. At time 2, NAND circuit 6 576 receives the asserted erase signal, but since its output was already at a logic zero value, the same 32 word lines will be addressed at that point. However, at time 3, NAND circuit 5 580 will also receive the asserted word line signal, causing a further 32 word lines to be asserted. This process will continue until all of the NAND circuits within the pre-decoder circuitry 200 have received the asserted word line signal, and accordingly have transitioned their intermediate output to a logic zero value, at which time all of the word lines will be asserted.

Such an approach means that the forced write operation used to overwrite the values in the memory array is performed in a staggered manner. This is illustrated schematically in FIG. 19. As shown by the transition 560, without the staggered approach discussed in FIGS. 18A and 18B, all 256 word lines will be asserted at the same time, but the slope will be relatively shallow since it will take significantly longer to drive the word lines to the logic one value. There will also be a significantly large in rush current. In contrast, when using the staggered approach, the word lines transition in blocks of 32, and due to the reduced loading the transition to the asserted value occurs more quickly. This is shown schematically by the series of transitions 565 shown in FIG. 19, and over the course of eight stages all of the word lines will transition to the logic one value. In fact, as discussed earlier with reference to FIG. 18B, there will be one additional redundant stage when the asserted erase signal reaches the NAND circuit that was already outputting a logic zero value, but that level of detail is omitted from FIG. 19 for clarity. Overall, it is found that the staggered approach enables the same result to be achieved in a very similar period of time, but with a much smoother power consumption behavior than would occur if all of the word lines were asserted at exactly the same time.

Whilst the delay elements are illustrated schematically in FIG. 18A by a series of inverters, it will be appreciated that the delay mechanisms can take a variety of forms, for example an inverter delay or a resistor/capacitor based delay, or a mixture of those delay types.

The steeper word line transitions that occur when using the staggered approach also significantly improve the writeability of the addressed bit cells, ensuring that they flip state more cleanly, without drawing too much cross current. This limits the total power consumption, and also enables the sizing of the components within blocks 450 of FIG. 17 to be reduced.

The granularity of the staggering of the propagation of the erase signal can be varied as desired. The more staggering steps introduced, the smaller the number of word lines asserted at each point in time, and the more smoothly the in rush current will be spread out. However, the more staggering steps introduced, the longer the delay that will be added. However, as the number of staggering steps is increased, this generally reduces the size of the circuits required, and improves the secrecy. It will be appreciated that a balance can be achieved between these various factors for each particular implementation.

In situations where the predetermined erase region is large, then strong write driver circuitry is required in order to be able to potentially overwrite up to all of the bit cells connected to a particular bit line pair. To implement a strong write driver often requires the provision of large transistors, and this can hinder normal operations. In particular the normal read and write operations may be slowed down by the presence of such large transistors. However, in accordance with the approach illustrated in FIG. 20, it is possible to significantly reduce the size of the transistors included within the write driver blocks 450 to manage the erase operation, thus reducing the capacitive load on the bit lines. In particular, by comparing FIG. 20 with the earlier described FIG. 18A, it will be seen that an extra delay (formed by inverters 600, 605, 610, 615) is introduced in the propagation of the erase signal to the first NMOS transistor 520. This extra delay is chosen so that for the first group of asserted word lines the corresponding forced write operation will have completed before the NMOS transistor 520 receives the asserted erase signal, and accordingly before the output signal "output 1" transitions to a logic zero value. As a result, only a relatively small number of the bit cells connected to a bit line are written to initially, and further, by the time the remaining staggering stages take place, those bit cells that have been written to now serve to assist the write driver circuitry in flipping the state of the remaining bit cells connected to the bit line. This hence provides a write assist mechanism, thus enabling the size of the components within the blocks 450 of FIG. 17 to be reduced.

Figure 21:
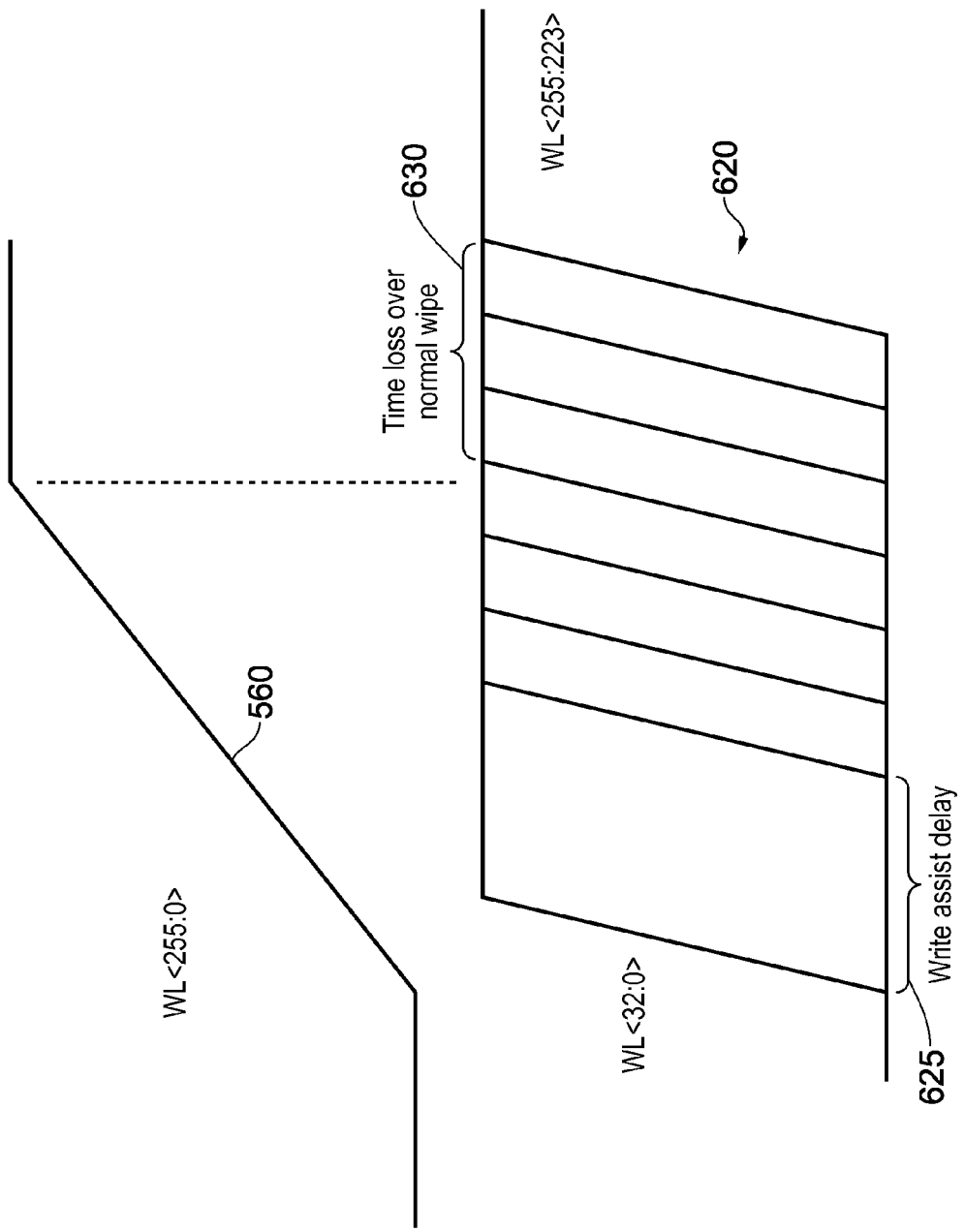
FIG. 21 is a timing diagram illustrating the timing of assertion of the word lines in accordance with one specific embodiment of the approach of FIG. 20.

As shown in FIG. 21, the use of this write assist mechanism introduces an additional delay 630, due to the increased initial propagation delay 625 of the asserted erase signal. However, other than the increased initial delay, the general profile 620 of the asserted word lines is similar to that as discussed earlier with reference to FIG. 19.

Figure 22:
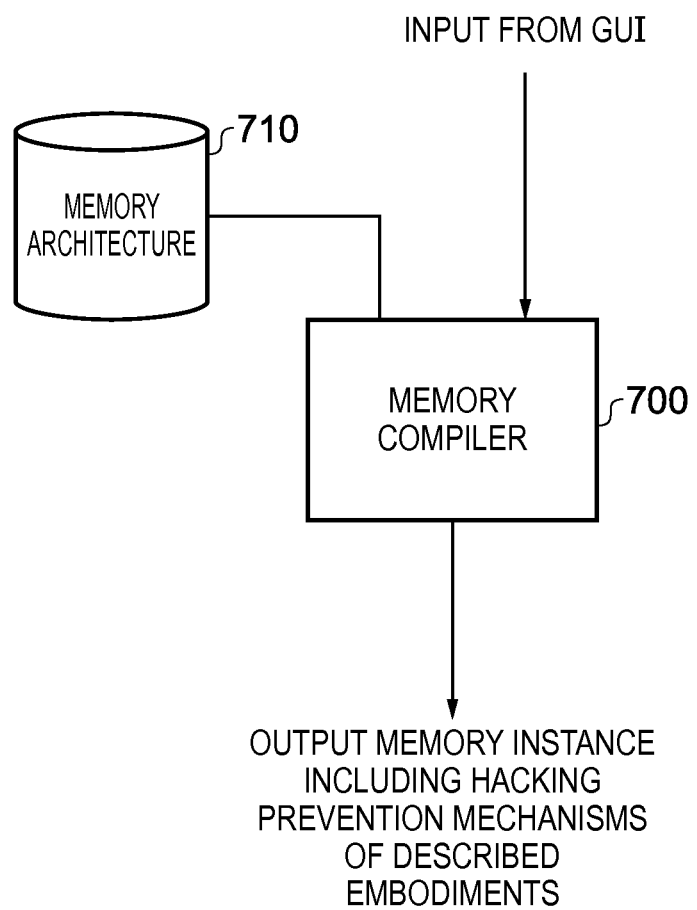
FIG. 22 is a diagram schematically illustrating the operation of a memory compiler to generate a memory instance including modified control circuitry and modified write driver circuitry in accordance with the described embodiments.

FIG. 22 schematically illustrates how a memory instance including hacking prevention mechanisms in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc. Input parameters entered via the GUI can also be used to select or deselect the various hacking prevention mechanisms described herein, such as the un-interruptible fast memory erase circuitry 902, the if-not timer circuitry 904, and the pulse intrusion circuitry 906 of FIG. 1.

The memory compiler 700 then generates the required memory instance based on the input parameters and the memory architecture 710. In accordance with one embodiment, the memory compiler includes, dependent on parameters entered via the GUI, additional components to implement the hacking prevention mechanisms of the above described embodiments, in the manner described with reference to the earlier figures.

Figure 23:
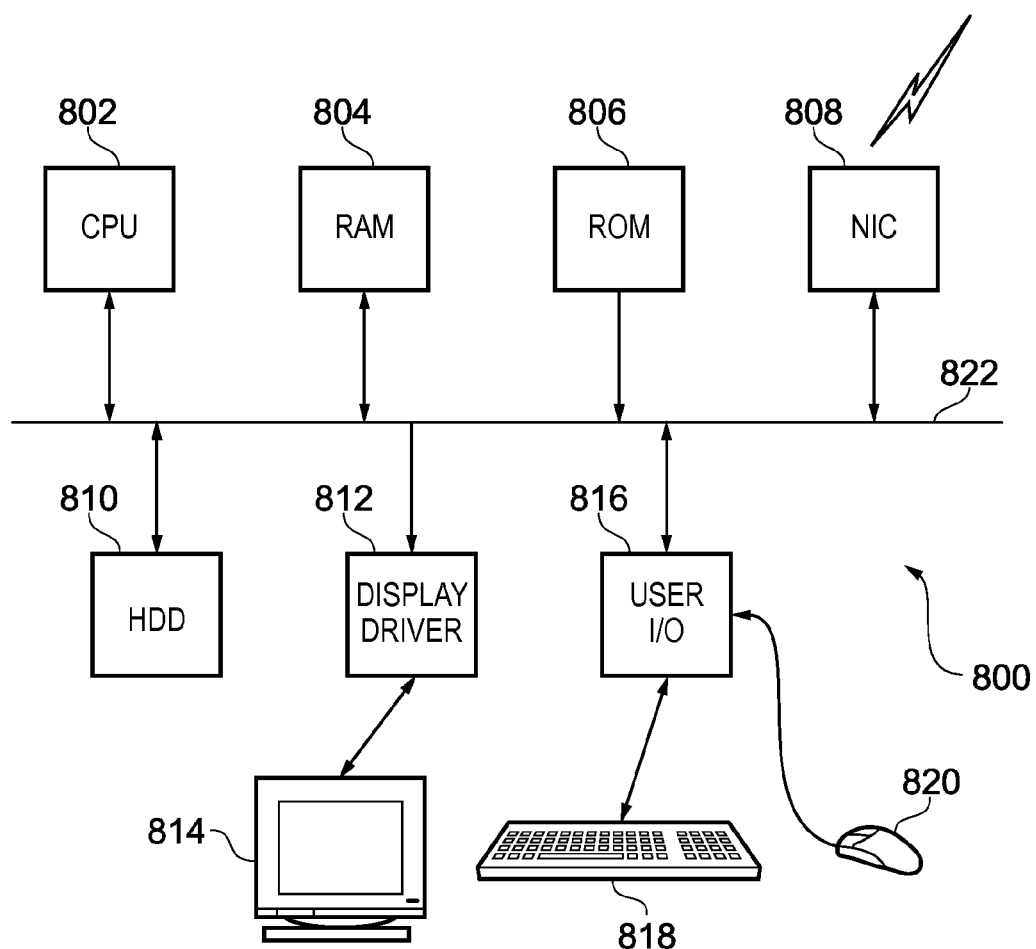
FIG. 23 is a diagram of a computer system on which a memory compiler operation may be performed to generate a memory instance conforming to the above described embodiments.

FIG. 23 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 23 is only one example.

From the above description of embodiments, it will be appreciated that these embodiments provide a particularly efficient and reliable mechanism for erasing an entire memory array, or predetermined portions of it, upon occurrence of a predetermined erase condition. This can be used to significantly improve security of data by avoiding a hacker making use of data remanence effects. Further, the described techniques occur in a clock independent manner, and accordingly even if a hacker were able to remove the clock signal from the memory device the erase process would still be performed and avoid the previously recorded data from being accessed.

Whilst the described techniques have particular application in respect of memory devices that are used to store secure or sensitive data, the techniques can also be applied in any other situations where it is desirable to erase multiple rows of a memory array in a time efficient manner.

Although particular embodiments have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. An apparatus comprising:
   a memory device comprising an array of memory cells, and configured to operate from a clock signal;
   erase circuitry, responsive to receipt of an erase signal in an asserted state, to perform a forced write operation independently of the clock signal in respect of each memory cell within a predetermined erase region of said array; and
   erase signal generation circuitry configured to receive a control signal and to maintain said erase signal in a deasserted state provided that the control signal takes the form of a pulse signal having at least a predetermined minimum frequency between pulses;
   the erase signal generation circuitry being configured to issue said erase signal in said asserted state if the control signal does not take the form of said pulse signal.

2. An apparatus as claimed in claim 1, wherein:
   said erase signal generation circuitry comprises capacitor circuitry, and output circuitry configured to generate the erase signal in dependence on an output from the capacitor circuitry;
   the capacitor circuitry being configured to switch between a charging operation and a discharging operation dependent on the control signal;
   the output circuitry being configured to generate said erase signal in said asserted state if the output from the capacitor circuitry reaches a predetermined activation voltage level; and if the control signal takes the form of said pulse signal the output from the capacitor circuitry being configured not to reach said predetermined activation voltage level, thereby causing the erase signal to be maintained in said deasserted state.

3. An apparatus as claimed in claim 2, wherein the capacitor circuitry is configured to perform said charging operation whenever the control signal does not contain a pulse, and to switch to said discharging operation for the duration of each pulse in said control signal.

4. An apparatus as claimed in claim 2, wherein the erase signal generation circuitry comprises a current controlled inverter circuit configured to provide an input to the capacitor circuitry in dependence on the control signal.

5. An apparatus as claimed in claim 4, further comprising bias voltage generation circuitry configured to generate a bias voltage provided to at least one component within the current controlled inverter circuitry to control a rate at which the voltage level of the output of the capacitor circuitry changes during at least one of said charging operation and said discharging operation.

6. An apparatus as claimed in claim 5, wherein:
the capacitor circuitry is configured to perform said charging operation whenever the control signal does not contain a pulse, and to switch to said discharging operation for the duration of each pulse in said control signal; and
the current controlled inverter circuitry is configured to use the bias voltage generated by the bias voltage generation circuitry to control the rate at which the voltage level of the output of the capacitor circuitry changes during said charging operation.

7. An apparatus as claimed in claim 1, further comprising control signal generation circuitry configured to generate the control signal input to the erase signal generation circuitry, the control signal generation circuitry comprising edge detector circuitry configured to receive an input signal and to generate a pulse within said control signal each time the input signal changes state between first and second voltage levels.

8. An apparatus as claimed in claim 7, wherein said edge detector circuitry comprises delay circuitry configured to generate a delayed input signal, and comparison circuitry configured to generate each said pulse dependent on a comparison between said input signal and said delayed input signal.

9. An apparatus as claimed in claim 8, wherein a delay introduced by said delay circuitry determines a width of each pulse generated by the edge detector circuitry.

10. An apparatus as claimed in claim 9, further comprising bias voltage generation circuitry configured to generate a bias voltage provided to at least one component within the delay circuitry in order to control said delay introduced by said delay circuitry.

11. An apparatus as claimed in claim 7, wherein said control signal generation circuitry further comprises pulse override circuitry configured, on detection of at least one predetermined condition, to prevent said control signal from taking the form of said pulse signal irrespective of the output of the edge detector circuitry, to thereby cause the erase signal generation circuitry to issue said erase signal in said asserted state.

12. An apparatus as claimed in claim 11, wherein said at least one predetermined condition comprises a condition indicating potential tampering with said input signal provided to said edge detector circuitry.

13. An apparatus as claimed in claim 12, wherein said pulse override circuitry comprises frequency comparator circuitry configured to detect if the input signal has the same frequency as a clock signal supplied to said frequency comparator circuitry, and in that event to prevent said control signal from taking the form of said pulse signal irrespective of the output of the edge detector circuitry.

14. An apparatus as claimed in claim 13, wherein said frequency comparator circuitry comprises a first flip flop circuit and a second flip flop circuit, both the first and second flip flop circuits being configured to receive said input signal, and being operated such that on a rising edge of a received clock signal the first flip flop circuit outputs a current value of the input signal received by the first flip flop circuit, and on a falling edge of the received clock signal the second flip flop outputs an inverted version of the current value of the input signal received by the second flip flop circuit.

15. An apparatus as claimed in claim 14, wherein the outputs from both the first and second flip flop circuits are subjected to a logical XOR operation in order to generate an output from the frequency comparator circuitry.

16. An apparatus as claimed in claim 11, further comprising logical AND circuitry configured to receive the output from the edge detector circuitry and the output from the pulse override circuitry and to perform a logical AND operation in order to generate said control signal, the pulse override circuitry being configured to generate a logic 1 output value in the absence of said at least one predetermined condition, but being configured to generate a logic 0 output value whilst said at least one predetermined condition is detected.

17. An apparatus as claimed in claim 1, wherein:
said array of memory cells is arranged as a plurality of rows and columns, each row of memory cells being coupled to an associated word line, and each column of memory cells being coupled to an associated at least one bit line;
the apparatus further comprises:
decoder circuitry configured to be responsive to a write operation to decode an address indication associated with the write operation in order to determine the row containing addressed memory cells for the write operation, and to issue, in dependence on said clock signal, an asserted word line signal on the associated word line for the determined row; and
write circuitry configured to be responsive to said write operation to control a voltage level of the associated at least one bit line for each of said addressed memory cells to cause write data to be written into said addressed memory cells;
the erase circuitry comprising the decoder circuitry and the write circuitry, the decoder circuitry being configured to be responsive to said asserted erase signal to issue, independently of said clock signal, said asserted word line signal on the word line associated with each row in said predetermined erase region; and
the write circuitry being configured to be responsive to said asserted erase signal to control the voltage level of the associated at least one hit line for each memory cell in said predetermined erase region, in order to cause erase write data to be written into the memory cells of said predetermined erase region.

18. An apparatus as claimed in claim 1, wherein said predetermined erase region comprises one of:
the entire array;
one or more rows of the array; and
one or more columns of the array.

19. A method of operating an apparatus to erase data in a memory device comprising an array of memory cells and configured to operate from a clock signal, the method comprising:

responsive to an erase signal in an asserted state, performing a forced write operation independently of the clock signal in respect of each memory cell within a predetermined erase region of said array;

maintaining said erase signal in a deasserted state provided that a control signal takes the form of a pulse signal having at least a predetermined minimum frequency between pulses; and issuing said erase signal in said asserted state if the control signal does not take the form of said pulse signal.

20. An apparatus comprising:

a memory means comprising an array of memory cell means, the memory means for operating from a clock signal;

erase means for performing, responsive to receipt of an erase signal in an asserted state, a forced write operation independently of the clock signal in respect of each memory cell means within a predetermined erase region of said array; and erase signal generation means for receiving a control signal and for maintaining said erase signal in a deasserted state provided that the control signal takes the form of a pulse signal having at least a predetermined minimum frequency between pulses;

the erase signal generation means for issuing said erase signal in said asserted state if the control signal does not take the form of said pulse signal.

21. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device formed by the apparatus as claimed in claim 1.

* * * * *